(12) United States Patent
Memarian et al.

(10) Patent No.: US 6,743,488 B2
(45) Date of Patent: Jun. 1, 2004

(54) TRANSPARENT CONDUCTIVE STRATIFORM COATING OF INDIUM TIN OXIDE

(75) Inventors: Hassan Memarian, Northridge, CA (US); Hitesh Patel, Moreno Valley, CA (US)

(73) Assignee: CPFilms Inc., Martinsville, VA (US)

( * ) Notice: Subject to any disclaimer, the term of this patent is extended or adjusted under 35 U.S.C. 154(b) by 0 days.

(21) Appl. No.: 09/851,321

(22) Filed: May 9, 2001

(65) Prior Publication Data

US 2003/0035906 A1 Feb. 20, 2003

(51) Int. Cl.⁷ .............................. B32B 7/02; B05D 5/12
(52) U.S. Cl. ...................... 428/1.4; 428/697; 428/212
(58) Field of Search .................... 428/212, 1.4, 688, 428/689, 697, 699, 701, 702, 938, 480, 432, 428, 426, 1.33

(56) References Cited

U.S. PATENT DOCUMENTS

| | | | |
|---|---|---|---|
| 4,065,600 A | 12/1977 | King | 428/432 |
| 4,187,340 A | 2/1980 | Oishi | 428/210 |
| 4,252,841 A | 2/1981 | Kinugawa | 427/108 |
| 4,255,474 A | 3/1981 | Smith | 428/46 |
| 4,345,000 A | 8/1982 | Kawazoe | 428/212 |
| 4,490,227 A | 12/1984 | Bitter | 204/192 SP |
| 4,568,578 A | 2/1986 | Arfsten | 428/34 |
| 4,585,689 A | 4/1986 | Ohta | 428/216 |
| 4,650,557 A | 3/1987 | Bitter | 204/192.12 |
| 4,888,210 A | 12/1989 | Isozaki | 427/126.3 |
| 4,977,013 A | 12/1990 | Ritchie | 428/212 |
| 5,009,922 A | 4/1991 | Harano | 427/37 |
| 5,225,273 A | 7/1993 | Mikoshiba | 428/323 |
| 5,342,676 A | 8/1994 | Zagdoun | 428/216 |
| 5,362,552 A | 11/1994 | Austin | 428/216 |
| 5,387,433 A | 2/1995 | Balian | 427/126.3 |
| 5,411,792 A | 5/1995 | Yukinobu | 428/212 |
| 5,520,996 A | 5/1996 | Balian | 428/216 |
| 5,536,466 A | 7/1996 | Ogawa | 264/400 |
| 5,538,905 A | 7/1996 | Nishioka | 437/24 |
| 5,667,880 A | 9/1997 | Okaniwa | 428/212 |
| 5,700,391 A | 12/1997 | Nogami | 252/299.01 |
| 5,728,231 A | 3/1998 | Negami | 148/33 |
| 5,763,063 A | 6/1998 | Pass | 428/216 |
| 5,763,091 A | 6/1998 | Kawata | 428/428 |
| 5,776,603 A | 7/1998 | Zagdoun | 428/336 |
| 5,780,149 A | 7/1998 | McCurdy | 428/336 |
| 5,851,642 A | 12/1998 | Sauvinet | 428/212 |
| 5,853,869 A | 12/1998 | Adachi | 428/325 |
| 5,981,059 A | 11/1999 | Bright | 428/336 |
| 6,040,056 A | 3/2000 | Anzaki | 428/432 |

Primary Examiner—Harold Pyon
Assistant Examiner—Sow-Fun Hon
(74) Attorney, Agent, or Firm—Bacon & Thomas, PLLC

(57) ABSTRACT

A transparent electrically conductive device which includes an indium tin oxide film is improved by providing an indium tin oxide film which contains a graded stack of individual indium tin oxide layers wherein the atomic percent of tin in the layers can be individually selected. Each indium tin oxide layer of the film contains 1–99 atomic percent tin. Each layer is made by a physical vapor deposition process or by sputter coating. Preferably the film which contains a plurality of indium tin oxide layers is applied to a transparent flexible substrate such as a polymeric sheet. Optional primer layers, hardcoat layers and topcoat layers may be included in the device.

41 Claims, 13 Drawing Sheets

TRANSPARENT CONDUCTIVE STRATIFORM COATING OF INDIUM TIN OXIDE

BACKGROUND OF THE INVENTION

1. Field of the Invention

The present invention pertains to the field of transparent electrical conductive coatings made of indium tin oxide which are applied to transparent substrates, especially flexible transparent polymeric film substrates. The invention also pertains to the method of making the coated substrates and the use of the coated substrates in electronic devices which require transparent conductive oxide (TCO) films having excellent electrical conductivity, mechanical durability and high transparency. Such electronic devices include liquid crystal displays (LCD), touch panels (TP) and pen entry devices, electroluminescent lamps (EL), personal digital assistants (PDA), organic light emitting devices (OLED), etc.

2. Background Information

Substrates such as flexible transparent polymeric films having a TCO coating thereon are widely used in the above noted devices because these coatings possess high optical transparency, high electrical conductivity and good mechanical stability. Indium oxide-tin oxide (indium-tin oxide commonly referred to as ITO) is often used as the TCO coating.

The indium-tin oxide coating used in this field of technology and in the present invention is a non-stoichiometric n-type semiconductor which exhibits high visible transmittance, low resistance and high infrared reflectance. For this reason, thin films of ITO are commonly used as the TCO coating in the above noted devices. Conventional reactive sputtering from a InSn alloy in an oxygen containing atmosphere (e.g., argon-oxygen atmosphere) is used to apply the ITO film or coating onto the substrate. A conductive ITO film is a partially oxidized mixture of indium and tin and thus the optoelectronic properties of such films are greatly affected by the level of oxygen admitted into the plasma during the deposition. The amount of oxygen in the ITO films used in this field of technology is well known to those skilled in the art.

On one hand, films with too little oxygen exhibit high sheet resistance and low visible transmittance. On the other hand, at a fully reacted state (complete oxidation), one achieves a transparent oxide with very high sheet resistance and high visible light transmittance. The manner of proceeding from a metallic layer to a fully oxidized layer depends on the feedback and control mechanisms employed during reactive deposition processes which are well known to those skilled in the art.

In the production of ITO coatings from an InSn target on a polymeric web (i.e., sheet), the in-situ measurement and control of the oxidation level is of pivotal importance. The traditional constant pressure controlled reactive sputtering of ITO works well and produces films with adequate properties. However, the use of such traditional constant pressure controlled reactive sputtering of ITO does not meet the demands of more stringent and sophisticated applications. This is because reactive sputter deposition of indium-tin oxide (ITO) from an alloy target is an extremely sensitive process. The quality of the deposited ITO is dependent on the ability to maintain a certain constant partial pressure of oxygen in the sputtering zone during the deposition process. Minor changes in the substrate outgassing, pumping speed, target condition or arcing can result in significant changes in the oxidation level of the deposited layer, thus producing an inferior conducting film. When producing sputtered ITO on continuous flexible substrates, on-line monitoring and feedback control in real time is essential for high quality products.

There are various methods in use today which provide for the monitoring and control of the reactant species in the glow discharge. These methods include direct or indirect partial pressure measurements and optical emissions spectroscopy. In particular, such methods include the use of a residual gas analyzer (RGA), an optical gas controller (OGC) or a plasma emission monitor (PEM). Each of the above devices provide a means for monitoring and controlling the amount of oxygen during deposition of the metal. It is well know to those skilled in the art that the amount of oxygen must be kept at a level to produce the aforementioned non-stoichiometric ITO coating which is not completely oxidized. Thus the oxygen atmosphere during deposition must be maintained at an oxygen deficiency to produce the required non-stoichiometric oxide coating.

ITO coated films are conventionally used in a wide range of applications which include touch panel devices. Touch panel devices have two opposing surfaces of the ITO films separated by spacers. Contact is made between the two opposing surfaces when the front surface is depressed by a finger or touch pen. Depending on the type of device, the location of the input is decoded by the electronic interface according to known technology. LCD devices typically include an array of transparent ITO electrodes which define the display segment or pixels to be activated. In EL displays electrical energy is converted to light energy (luminescence). EL displays use a thin film of phosphor sandwiched between dielectric layers that is sandwiched between two electrodes, one of which is ITO. When an AC voltage is applied to any of the electrodes, the phosphor will be excited so that it emits light.

Reliability during continuous operation is a problem associated with these devices. In the touch panel device it has been observed that the electrical resistance increases after continuous cycling. The ITO surfaces crack or fracture at the touch location and these fractures propagate over time to totally disrupt the operation of the device. Countermeasures have been employed in these devices to help prevent the aforementioned cracking problem. In particular, it is known to deposit a thin layer of palladium, platinum, gold or oxides of these metals onto the ITO film to protect the ITO and/or increase the surface adhesion properties of the ITO layer for subsequent processing. Methods to promote crystallization of the ITO surface after deposition have also been used to grow a hard surface. Problems have also been observed during the fabrication of EL lamps. It has been observed that the ITO film in EL lamps becomes delaminated from the polymeric substrate during processing of the phosphor layer. Pretreatment methods have been utilized to increase the surface energy of the substrates during deposition, but with limited success. Other techniques such as applying a thin metallic or oxide layer on top of the ITO has also been tried with good results.

As active metric liquid crystal displays (AMLCD) become the dominant display for portable systems such as pagers, phones and personal digital assistants, ruggedness and impact resistants become highly desirable for handling considerations as well as for flexibility during their fabrication.

SUMMARY OF THE INVENTION

It is an objective of the present invention to provide an improved sputtered TCO coating of ITO on a transparent substrate, especially a transparent polymeric film substrate, for use in applications where TCO films are conventionally employed.

It is also an objective of the present invention to improve conventional electronic devices which include a TCO as a component thereof by using the ITO of the present invention as the TCO.

It is also an objective of the present invention to provide a method for making an improved transparent conductive coating of ITO on a transparent substrate.

These and other objectives are obtained by forming a multilayered transparent conductive film or coating of ITO on a transparent substrate wherein the ITO film or coating includes distinct layers of transparent conductive ITO. The term "transparent conductive coating of ITO" as used herein refers to transparent conductive ITO coatings which are conventionally employed in well known electronic devices which require a TCO. Such devices include conventional liquid displays (LCD), touch panels (TP), electroluminescent lamps (EL), personal digital assistants (PDA), organic light emitting devices (OLED), etc. Henceforth such transparent conductive ITO coatings will be referred to herein as ITO coatings. In addition, the term "conductive" as used herein refers to electrical conductivity.

The layers of ITO are spatially distinct from each other and differ in terms of the proportion of indium to tin in each layer. Aside from the proportion of indium to tin (i.e., the relative amount of indium and tin on an atomic basis) in each layer, the compositional characteristics of the ITO coatings are otherwise the same as the nonlayered ITO which is conventionally used in TCO materials.

The composition (i.e., relative amount of In and Sn in each layer) is selected in each layer to provide desired properties at varying depths in the ITO coating. It has been discovered that the problems relating to lack of durability and other mechanical and physical disadvantages of the prior art ITO coatings can be overcome by providing the multilayered ITO of the present invention without adversely affecting the optical properties of the ITO film. For example, in the present invention the composition of one or more layers of the ITO film can be selected to provide a chemical resistance barrier which protects the entire structure while the composition of the other ITO layers can be selected to optimize other characteristics without adversely affecting optical properties of the device. The composition of any of the ITO layers can be custom made to provide desired physical characteristics at specified locations on the ITO surface and within the depth of the ITO coating.

The TCO film of the present invention comprises a plurality of ITO layers with at least one ITO layer being different (i.e., having a different In to Sn ratio) from one or more other ITO layers. Thus in its simplest embodiment, a substrate has an inner ITO layer thereon and an outer different ITO layer on the inner ITO layer. Additional ITO layers may be included.

The plurality of layers forms a stack of two or more layers, each layer having a finite thickness wherein the composition or proportion of In to Sn is substantially uniform throughout the thickness thereof. By substantially uniform it is meant that a given layer is as uniform as humanly possible when sputter coated using a homogenous target containing the desired ratio of In to Sn. The uniform composition of each layer exists as a finite thickness, e.g., about at least 50 angstroms, preferably 50–600 angstroms, in each layer. Thus there is no continuous gradient of compositional change throughout the entire thickness of the entire ITO coating. Naturally there may be a zone of nonuniformity between layers due to inherent imperfections in the sputtering process when one thin ITO layer is sputter coated (using one target) onto a different thin ITO layer (using a different target). Such zones may be referred to as transition zones between the ITO layers. The changes in composition through the transition zones may be gradual.

It is possible that two or more ITO layers in a stack containing at least three ITO layers, may be compositionally identical to each other. However, compositionally identical layers are separated from each other by another compositionally different layer.

The substrate coated with the ITO layers may include additional layers which are typically used in TCO devices in this field of technology. Such layers include protective top coat layer, primer layer, hard coat, etc. The substrate may thus include other layers as a component thereof.

Since the above-described multilayered ITO film has compositionally different ITO layers wherein the compositional difference lies in the In to Sn atomic ratio, the ITO coating may be referred to as a graded ITO stack.

The substrate used in the present invention may be any of the commonly employed substrates which are typically used in electronic devices which employ a TCO coating. Such well known substrates include transparent flexible polymeric film or sheets. Suitable polymers for making the polymeric film include polyester such as polyethylene terephthalate (PET), polyurethane, polysulfone, and polycarbonate.

Sputtering is advantageously used to deposit the ITO layers of the TCO film so that high temperatures and other physical and chemical conditions which could harm the substrate, especially a polymeric substrate, can be avoided. Other physical vapor deposition procedures, such as evaporative coating, may be employed. Sputtering is particularly advantageous because it can deposit the ITO layer at ambient or room temperature (e.g., about 70° F.). Any conventional sputtering method and apparatus may be used; it being understood that each compositional layer requires the use of a target which has the corresponding proportion of In to Sn. Sputtering coaters which advance a polymeric sheet or web from one roll to another roll with a plurality of sputtering stations positioned in the path of the sheet or web are particularly advantageous because the various layers of ITO can be sputter coated onto the sheet in one pass of the sheet as it advances from one roll to the other roll. Such sputtering coaters are well known and are commercially available. An example of such a sputtering device is shown in U.S. Pat. No. 4,977,013, the specification of which is incorporated herein by reference.

The sputtering target may be an indium-tin alloy. When sputtering with an indium-tin alloy, the sputtering is performed in an atmosphere which contains oxygen according to well known techniques so that the deposited material is the desired oxides of indium and tin. As noted above, the indium tin oxide coating has a nonstoichiometric amount of oxygen so that the coating has the required electrical conductivity and transparency; and the amount of oxygen contained in the ITO coating in the present field of technology is well known to those skilled in the art. Alternatively, instead of using an alloy target in an oxidizing atmosphere, the sputtering may use a tin oxide-indium oxide ceramic (e.g., a mixed ceramic powder of indium oxide and tin oxide) as the target. Such a target should have an oxygen content equal to the oxygen content in the corresponding film or ITO layer which is deposited.

The amount of indium and tin in a particular ITO layer can be expressed in terms of atomic percentage wherein the atomic percent of one of the two metals is in relationship to the total content of those two metals in the particular layer.

Thus an ITO layer having 1% tin will have 99% indium and an ITO layer having 5% tin will have 95% indium. Similarly an ITO layer having 99% tin will have 1% indium and an ITO layer having 95% tin will have 5% indium. The above percentages are on an atomic basis. Unless stated to the contrary, all of the percentages of tin and indium described herein are on an atomic basis as described above.

The present invention is based on the discovery that TCO's having an atomic percentage of 1–99% tin deposited by sputtering techniques can be improved by stacking ITO layers in the manner described above to form a graded array or stack of the coatings. Each ITO layer of the stack embodies a specific physical property that has been tailored for the desired device which uses the TCO layer. For example the touch input device has a front surface ITO layer which possesses greater tin content than the back surface that is in contact with the polymeric film. This type of structure has enhanced mechanical characteristics for continuous touch input while maintaining excellent bulk conductivity and high transparency comparable to the conductivity and transparency of conventional single composition ITO materials. More specifically, multi-compositional graded ITO structures of the present invention provide for more rugged features which are suitable for a variety of new electronic devices. The multi-compositional ITO also possesses greater environmental stability when exposed to high temperature and humidity conditions.

It has been discovered that the TCO's of the present invention deposited by sputtering techniques are more durable and possess greater flexibility which is required for touch type devices in comparison to the TCO's of the prior art.

DETAILED DESCRIPTION OF THE INVENTION AND PREFERRED EMBODIMENTS

Figures 1, 2:
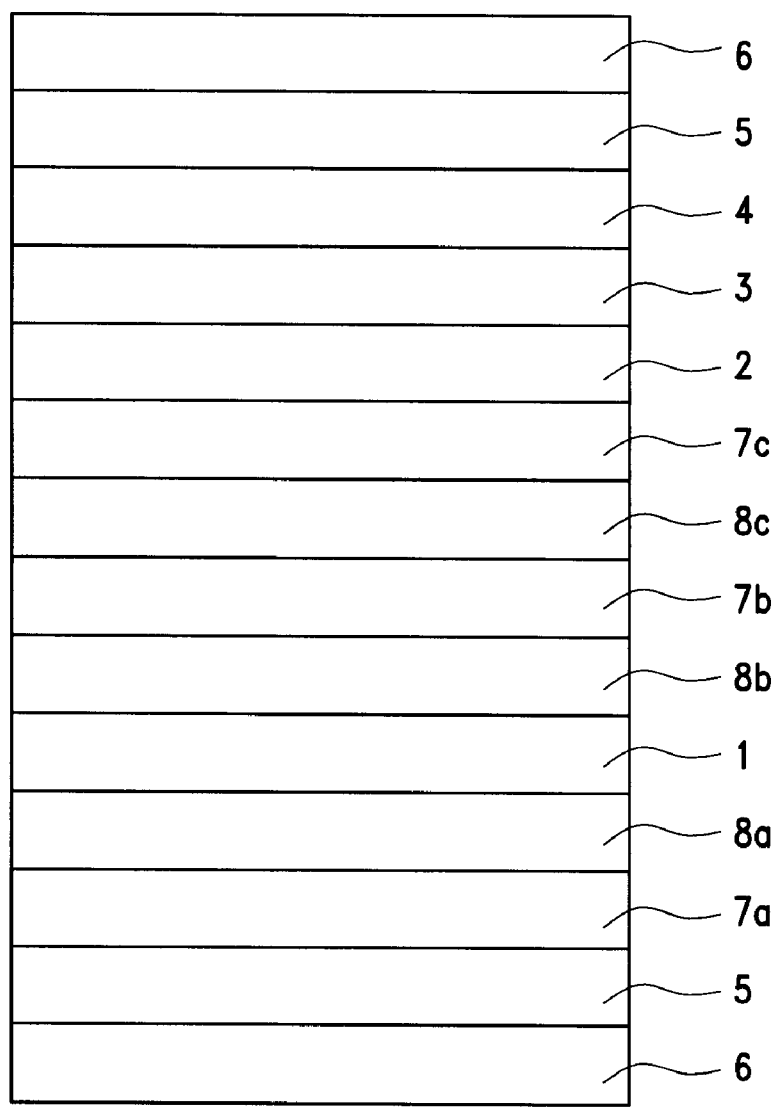
FIG. 1 is a cross-sectional representation of an embodiment of the invention which includes two different ITO layers on a substrate.
FIG. 2 is a cross-sectional illustration of another embodiment of the invention which includes a plurality of ITO layers and other layers on a substrate.

In a preferred embodiment the substrate is a transparent material, preferably a transparent polymer. Most preferably the substrate is a flexible polymeric sheet, capable of being provided in a roll format. Examples of suitable polymeric substrate material include PET and polycarbonate. A preferred substrate is heat stabilized PET. Heat stabilized PET film is well known to those skilled in the art. During heat stabilization the film is stabilized against shrinkage by heating and stretching the film. In addition transparent materials which are conventionally used in this field of technology may be used in the present invention.

The ITO layers and other materials used to make the TCO coated substrate should have a high degree of transparency. The standard for transparency may be the same as the transparency standards employed for conventional TCO coated substrates used in this field of technology. Preferably the materials such as the ITO layers should have a high degree of transparency so that the overall visible light transmission of the TCO coated substrate is at least 75%, more preferably at least 85%.

The ITO layers used in the present invention have a refractive index (n) in the range of 2.0 to 2.2 within a visible range of 450 nm and 650 nm. The refractive index of a material is the ratio of the speed of electromagnetic energy in a vacuum (or, for practical purposes, in air) to that in a transparent medium.

The ITO layers used in the present invention typically have an absorption coefficient in the range of 0.01 to 0.02 within the visible light transmittants of 450 nm and 650 nm. Absorption coefficient of a material is defined as a measure of attenuation caused by absorption of electromagnetic energy that results from its passage through a medium. It is described by the term "k" and in usually expressed in units of reciprocal distance.

The ITO layers form a graded ITO film. The graded ITO film preferably has a sheet resistance which varies from 1 to 10,000Ω per square.

The various embodiments of the present invention include a transparent electrically conductive film of indium tin oxide on a substrate wherein the film of indium tin oxide has a proportion of indium to tin atoms which is nonuniform throughout the thickness of the film such that the indium and tin atoms are distributed throughout the thickness of the film to form a plurality of indium tin oxide layers, each of which has a finite thickness (i.e., the film of indium tin oxide comprises a plurality of indium tin oxide layers so that the film is in the form of a graded stack of ITO layers). The proportion of indium and tin is substantially uniform throughout the finite thickness of any given layer. In addition, the various embodiments of the invention may include any number and combination of primer layer or layers and hardcoat layer or layers to achieve benefits which are well known to those skilled in the art through the use of such hardcoat and primer layers.

One or more layers of transparent electrically conductive indium zinc oxide (IZO) layers may also be included in the various embodiments of this invention. An example of an IZO layer is the IZO layer described in U.S. Pat. No. 6,040,056; the specification of which is incorporated herein by reference. Preferably the IZO layer contains zinc in the amount of 0.1 to 9.99% by weight based upon the total weight of zinc and indium in the layer (i.e., atomic weight percent). The IZO layer or layers may be located anywhere in the multilayered articles of the present invention. The IZO layer or layers may be applied by known coating techniques such as vacuum coating especially sputter coating. Thus, the transparent and electrical characteristics of an IZO layer may be obtained by incorporating such a layer in the present invention. In addition, the IZO layer may also function as a protective topcoat layer or as an adhesion primer layer as further described below.

In its simplest embodiment, the present invention includes a substrate which contains a first transparent conductive ITO layer thereon and a second transparent conductive ITO layer applied to the first ITO film. The first and second ITO layers in this simplest embodiment will have different relative amounts of indium and tin. The substrate may have any desirable thickness taking into consideration the type of device in which the TCO coated film is to be used. The thicknesses of such coated films are well known to those skilled in the art. Preferably the substrate thickness will vary in the range of 1–25 microns. The thickness of each ITO layer preferably varies in the range of 5–10,000 angstroms. Preferably the thickness of the multilayered ITO film is 10–100,000 angstroms.

The simplest embodiment of the invention as described above is illustrated in FIG. 1. The embodiment of the invention illustrated in FIG. 1 includes substrate 1, first transparent conductive ITO layer 2 and second transparent conductive ITO layer 3. The amount of tin in each of the layers 2 and 3 has an atomic percentage in the range of 1% to 99% relative to the amount of indium and tin contained therein.

Additional embodiments of the invention are illustrated in FIG. 2. FIG. 2 includes substrate 1, first ITO layer 2 and second ITO layer 3. The substrate and ITO layers illustrated in FIG. 2 have the same characteristics as the corresponding numbered layers in FIG. 1. Throughout this specification, it is to be understood, unless indicated to the contrary, that the same reference numerals used throughout the figures pertain to the same elements.

A transparent hardcoat is advantageously applied to flexible substrates or at other locations. The hardcoat layer provides enhanced mechanical characteristics as well as barrier properties. The hardcoat layers which are optional in this invention, may be applied by any conventional technique such as by wet chemistry, vacuum deposition or sputter coating. The positions of three optional hardcoat layers in FIG. 2 are illustrated by reference numerals 7A, 7B and 7C. Thus, a hardcoat layer may be deposited on either side of the substrate. In order to enhance adhesion of the hardcoat to the substrate, a primer layer may be deposited on either side of the substrate. Thus FIG. 2 shows two primer layers 8A and 8B deposited on either side of substrate 1. The above-noted primer layers are optional. The primer and hardcoat layers may be utilized in any desired location in the device at the present invention.

FIG. 2 also illustrates an additional primer layer 8C deposited on top of hardcoat layer 7B. Primer layer 8C serves to improve the adhesion of an additional optional hardcoat layer 7C.

The embodiment illustrated in FIG. 2 contains at least 2 ITO layers (i.e., layers 2 and 3). An optional third ITO layer 4 may be deposited on top of ITO layer 3. Additional optional ITO layers represented by reference numeral 5 may be included on top of ITO layer 4 and/or next to hardcoat layer 7a.

A protective topcoat layer 6 is optionally applied on the top and/or on the bottom of the multilayered structure shown in FIG. 2. The protective topcoat layers may be the same or different from each other. Any combination of hardcoat layers, primer layers and graded ITO stacks may be used in the invention in between the optional protective topcoat layers.

The optional hardcoat layer or layers may be the same or different from each other. Preferably each hardcoat layer has a thickness which ranges from 0.5–25 microns, more preferably from 5000 to 100,000 angstroms. Typically, the hardcoat layer is chosen to be vacuum compatible for reduced degassing properties so that there is a minimum of degassing when additional materials are vacuum deposited onto the hardcoats. Suitable materials for the hardcoat layers include polyurethane, polymerizable long chain acrylics and methoxsiloxanes, silicates, densely cross-linked acrylic polymers, solvent-case epoxies and combinations of the above.

A preferred hardcoat useful in this invention is an inorganic hardcoat having an index of refraction between about 1.4 and about 2.0. Such a hardcoat may be made from $Al_2O_3$ and/or $SiO_2$.

When two or more primer layers are used in the invention, they may be the same or different from one another. The primer layer has an average thickness of about 2 angstroms to 100,000 angstroms, preferably 5 angstroms to 100,000 angstroms. In one embodiment the primer layer is 5–10,000 angstroms thick. The primer layer or layers used in this invention may be made from any of the organic or inorganic materials which are currently used as primer layers in the prior art TCO coated films used in the technological field of this invention.

The primer layer or layers may be selected to facilitate adhesion and/or to serve as a barrier. Suitable materials for use as an adhesion primer layer include metal, metal nitride, metal oxide and metal carbide. Organic compounds may be used for a barrier primer layer. Organic barrier primer coatings provide protection against oxygen and moisture penetration and also provide nucleation sites for the growing ITO films. Conductive polymers made from polyanilin are suitable for use as a barrier primer coating. An adhesion primer layer preferably has a thickness in the range of 5–10,000 angstroms and the barrier primer layer preferably has a thickness in the range of 50–10,000 angstroms.

Preferably the adhesion primer layer is a metal oxide or metal nitride of a metal selected from the group consisting of W, Ti, Cr, Ni, Cu, Zr, Hf, Ta, Al and Si. More preferably the adhesion primer layer is $TiO_2$, $Al_2O_3$, $Ta_2O_5$, IZO, TiN, ZrN, TiC, $SiO_2$ or $W_2C$. $SiO_2$ and $TiO_2$ are particularly preferred for the primer layer.

Typically the primer layer is used as an adhesion promoting layer between the hardcoat and the ITO layers. Primer layers may also be utilized between the ITO layers of the graded ITO stack. $TiO_2$ is particularly preferred for the primer layer because it minimizes surface outgassing from the hard coated substrate. By minimizing outgassing, structures of the invention using a thin $TiO_2$ layer are considerably more stable and uniform during the deposition of the ITO coating.

Without such a $TiO_2$ layer other techniques such as chemical treatment, corona discharge or glow discharge are used in an attempt to provide adequate adhesion between the hard coated substrate and the ITO layers. All of these prior art attempts, however, provide insufficient adhesion and are unduly expensive or have other production problems associated with them.

The protective topcoat layer or layers (which are optional in this invention) may be made from any of the organic or inorganic materials which are conventionally used for protective topcoatings in this field of technology. Suitable protective topcoat materials include metal, metal oxide, metal nitride and metal carbide. Representative metals include Pd, Au, Ni, Pt and Cr and the metal alloys NiCr, AuAg, CuPd and CuAg. Suitable metal oxides for the protective topcoat include $SiO_2$, $TiO_2$, $Al_2O_3$, IZO and $Ta_2O_5$. Suitable metal nitrides include TiN and $Si_3N_4$. Suitable metal carbides include TiC and $W_2C$. In addition to the above materials, the protective topcoat may be made from a combination of any of the aforementioned metals, metal alloys, metal oxides, metal nitrides and metal carbides.

The protective topcoat may be applied to one or both sides of the multilayered structure as a thin protective layer. These protective topcoat layers are highly desirable because they protect the device from physical and chemical damage. The protective topcoat may have any desirable thickness (e.g., 5–100,000 angstroms) in order to provide the desired protective utility in accordance with known principles in this field of technology. The protective topcoat layer is advantageously applied to a thickness in the range of 5–5,000 angstroms when the topcoat is made of any of the aforementioned metals, alloys, metal oxides, metal nitrides or metal carbides. A preferred thickness for the protective topcoat is in the range of about 5–100 angstroms.

In addition to the above mentioned metals, metal alloys, metal oxides, metal nitrides and metal carbides, the protective topcoat layer may be made from organic compounds which are well known for making protective topcoats in film technology. Organic topcoats preferably have a thickness in the range of 10–100,000 angstroms.

The organic protective topcoats are advantageously made from well known organometallic compound topcoatings which are typically used in the prior art to form a protective layer over a thin film coating. These well known organometallic compounds have carbon atoms of organic groups which are bound to metal atoms. An example of such an organometallic topcoat is a conventional organo-titanium topcoat which is applied in the form of a solution (i.e., an organo-titanium based solution). Other protective coatings such as an anti-finger printing layer can protect this surface by lowering the surface energy. This subassembly allows a lesser degree of contact with the coating. An example of this type of anti-smudge product layer is a fluorine-containing organopolysiloxane solution. Florine-containing organopolysiloxane solutions are commercially available from various sources including 3M Corporation.

Figure 3:
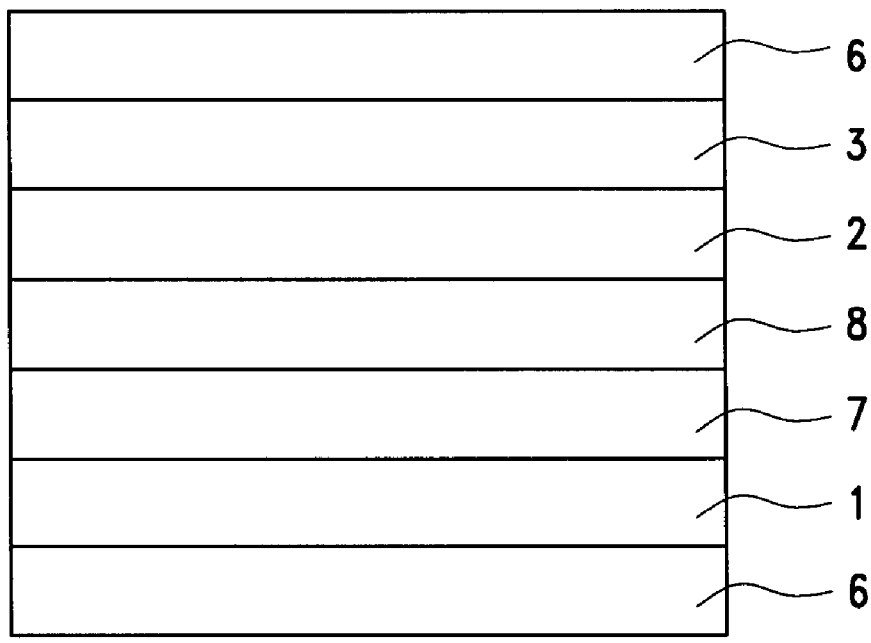
FIG. 3 is a cross-sectional illustration of another embodiment of the invention which includes a plurality of ITO layers and other layers on a substrate.

Another embodiment of the invention is illustrated in FIG. 3. The embodiment illustrated in FIG. 3 includes substrate 1 upon which is deposited hardcoat layer 7. A primer layer 8 is deposited on hardcoat layer 7. The primer layer 8 improves the adhesion of a first ITO layer 2 which is applied directly onto the primer layer. A second ITO layer 3 is deposited onto the first ITO layer 2. Any of the primer layers, hardcoat layers, ITO layers and substrate materials described above may be used in the embodiment shown in FIG. 3.

Preferably the first ITO layer contains 10 atomic percent Sn and 90 atomic percent In and the second ITO layer contains 20 atomic percent Sn and 80 atomic percent In. The first and second ITO layers are preferably deposited by DC sputtering or pulsed sputtering techniques. The first ITO layer is sputter deposited directly on the primer layer to provide enhanced adhesion of the ITO coatings.

Any of the protective topcoat layers described herein may be coated onto the second ITO layer of the embodiment illustrated in FIG. 3. Thus, the embodiment shown in FIG. 3 may include a thin protective top layer of metal selected from the group consisting of Pd, Pt, Ni, Cr and oxides thereof. The protective topcoat layer preferably has a thickness in the range of 5 angstroms through 100 angstroms. The protective topcoat used in the embodiment shown in FIG. 3 may be deposited on or both sides of the multilayered structure. Thus, the embodiment of FIG. 3 may optionally include one or both of the protective topcoat layers 6. The primer layer 8 shown in FIG. 3 is preferably a thin coating of $TiO_2$ having an average thickness of 2 angstroms-100 angstroms, most preferably 5–100 angstroms. This primer layer is deposited between the hardcoat layer 7 and the innermost ITO layer 2 in FIG. 3.

In another preferred embodiment the second ITO layer 3 (i.e., the outermost layer) contains 5 atomic percent tin and 95 atomic percent indium and has a surface energy which is greater than 50 dynes/$cm^2$.

In another preferred embodiment of the structure shown in FIG. 3, the first ITO layer 2 (i.e., the innermost ITO layer) contains 40 atomic percent tin and 60 atomic percent indium.

All of the above described embodiments which are illustrated in FIG. 3 may further include additional ITO layers in accordance with this invention.

The primer layer in the embodiments illustrated by FIG. 3 is preferably a thin sub-layer of $SiO_2$ or $TiO_2$ deposited on the hardcoat before the first ITO layer 2.

The ITO layers used in this invention are preferably deposited by single or multiple cathode sputtering processes. In one embodiment of the invention, the ITO layers are deposited by a dual cathode sputtering method. A dual cathode sputtering method employs a mid-frequency AC sine wave pulse power supply. Dual cathode systems use two magnetron cathodes which are disposed side by side. Dual cathode systems minimize problems with traditional DC magnetron sputtering, including arc control and inherent anode problems.

Inherent anode problems arise in reactive DC sputtering because the process chamber, the anode, as well as the greater part of the target, become covered by randomly grown insulating layers. The coverage of the anode and shielding with the insulating layer results in varying and difficult process conditions. Many "micro-arcs" are created during the sputtering of oxides which causes defects in the deposited layer. It is known to use RF sputtering techniques to avoid this arcing, but the industrial applicability of RF sputtering is very restricted due to its low deposition rates and difficulty in matching network requirements.

In dual cathode sputtering systems, two magnetron sources are connected to a bi-polar pulse generator so that each cathode alternately acts as a cathode and as an anode of a magnetron discharge. In contrast to DC sputtering, the power is fed into the reaction discharge in a pulsed mode with a frequency in the range of 20–100 khz, which hinders the discharging of insulating regions and prevents the target from arcing. Dual cathode sputtering provides for the creative sputter deposition of coated materials which otherwise could not be produced on a large scale using DC sputtering technology. Dual cathode magnetron sputtering methods offer the following advantages over DC sputtering methods used in the prior art and other prior art coating technologies, such as DC and RF methods:

1. deposition rates are higher than an equivalent DC and RF type sputtering methods;
2. dual cathode magnetron sputtering provides increased process stability over long operating periods;
3. dual cathode magnetron sputtering minimizes layer imperfections by eliminating arcing; and 4. cross-web uniformity of less than 2% can be readily achieved with dual cathode magnetron sputtering.

Dual cathode sputtering methods are preferred in the present invention especially for the production of ITO composites which comprise multiple graded layers. Dual cathode sputtering is especially preferred where part of the TCO structure utilizes highly insulating (e.g., dielectric) materials. Arcing in reactive DC sputtering of constructions of highly insulating materials is initiated by the electrical breakdown processes of the insulating layer on the magnetron cathode. This is because the deposition equipment includes a looping magnetic field which restricts the sputter erosion of the target to the "racetrack" area. In this area, the sputter rate is higher than the growth caused by back-sputtering. However, in a location further away from the racetrack, growth rate exceeds target erosion and consequently these parts of the target will be covered by an insulating layer. This coverage will cause arcing of various types. Because of these arcs, defects will be produced in the coating layer and it is also very difficult to control the process.

The above-mentioned problem regarding DC sputtering can be resolved in principle by using RF techniques. However, RF sputtering does not provide high deposition rates and requires substantial investments in matching power supplies. RF sputtering also generally entails high thermal substrate loads and high particle energy. Thus, RF sputtering is unsuitable for large area substrate coatings and for thermally sensitive flexible film substrates which are used in the present invention.

In another embodiment of the present invention, the method of depositing the ITO layers is symmetric/asymmetric bi-polar pulsed DC sputtering. Asymmetric bi-polar pulsed DC sputtering is preferred for single cathode sputtering because it minimizes problems with target poisoning associated with reactive DC sputtering methods. In reactive DC sputtering methods, there is a tendency to build up insulating layers on the target surface (i.e., target poisoning). When an insulator is deposited on the surface of the target, a capacitor is formed. The target acts as one conductor while the plasma acts as the other conductor and the insulating film forms the dielectric of the capacitor. Problems then occur because DC currents cannot flow through a capacitor. The first problem is that, without current flow, there can be no sputtering from this area of the target. Current flow is ion current and therefore, if no argon ions strike the area, then no target atoms can be freed and therefore no sputtering can occur. The second problem is that the capacitor formed may not have enough dielectricity to withstand the capability to charge all the way up to the applied voltage. If not, the breakdown of the insulation will cause a sudden release of charge carriers, forcing the local current density to increase into the discharge region, which results in arcing. This arcing causes defects in the insulator films. Asymmetric bi-polar pulsed DC sputtering, on the other hand, permits the formation of conditions which cause insulators on the target to be sputtered first with a higher sputter yield than base material. This type of preferential sputtering effectively eliminates target poisoning. Preferential sputtering is accomplished by adding a reverse voltage bias pulse to the normal DC waveform. If the typical sputtering runs at −400 volts, the pulse is rapidly reversed to about +100 volts, causing the capacitor to become oppositely charged (−100 volts) on the surface exposed to the plasma. No sooner the reverse pulse ends and the voltage returns to sputter mode (−400 volts), the plasma side of the capacitor is charged to −100 volts. When the target reaches −100 volts, the effective voltage on the plasma is −500 volts. Thus the argon ions are drawn by electrostatic attraction to the insulators and strike with extra energy (−500 volts), which sputters the insulators off the target first, eliminating target poisoning and arcing.

In general, for insulating layers, one can use pulse DC sputtering for increasing the deposition rate, eliminating arcing and obtaining high quality film at low temperatures. Unlike sinusoidal (AC) sputtering, the bi-polar pulsed DC (square waveform) gives independent control of "on and off" times to adjust the balance between plasma density and avoidance of arcing. The positive and negative pulse widths are adjustable over a considerable range from a few microseconds up to about ½ and variable off times are available between the pulses. Frequency can be varied.

Dual cathode sputtering methods utilizing medium frequency AC pulsed power supply and asymmetric bi-polar DC sputtering techniques are easily adaptable to wide area role coating machines capable of depositing anti-reflective layers over a continuous length of substrate material.

In another embodiment of the invention the process of controlling the reactive deposition of an oxide on a polymer substrate with sputtering is plasma emission control (PEM). To produce a stable product it is necessary to maintain a constant deposition rate and a constant utilization of oxygen gas during the coating process. Plasma emission monitors and the use thereof in regulating the amount of oxygen during reactive sputtering procedures are well known to those skilled in the art. A description of a suitable plasma emission monitor which can be used in the present invention is described in the publication by Patel et al.; Methods of Monitoring and Control of Reactive ITO Deposition Process on Flexible Substrates with DC Sputtering; Society of Vacuum Coaters; 39th Annual Technical Conference Proceedings (1996) ISSN 0737-5921; pages 441–445. The text of the aforementioned publication is incorporated herein by reference.

As noted in the aforementioned publication, optical emission spectroscopy is a versatile technique used to characterize and determine the presence of various atoms in a glow discharge plasma and it has been widely used in sputtering. The optical emission of the plasma provides a means to monitor the relative abundance of these atoms present in the plasma during reactive deposition. For depositing films of ITO, the composition of the plasma is continually changing with changes in flow, substrate outgassing, target composition rates and various other parameters. Therefore, a relationship between the emission intensity (I) and certain process parameters is crucial in achieving the correct coating stoichiometry, as well as maintaining a stable process. The optical emission intensity (I) of atoms is due to an electron transition between an upper atomic energy level k and lower energy level i. The change in energy is given by:

$$\Delta E = E_k - E_i = h\nu = hc/\lambda_{vac}$$

where $\nu$ is the frequency and $\lambda$ vac is the wavelength in a vacuum, and h is Planck's constant.

The line intensities emitted by the glow discharge are directly proportional to the density of atoms present. For a homogenous light source of intensity I:

$$I_{ki} = h\nu\, N_k A_{ki}/4\Pi$$

where $A_{ki}$ is the probability of exciting an atom to state k, and $N_k$ is the density of excited atoms in the upper level.

Figure 9:
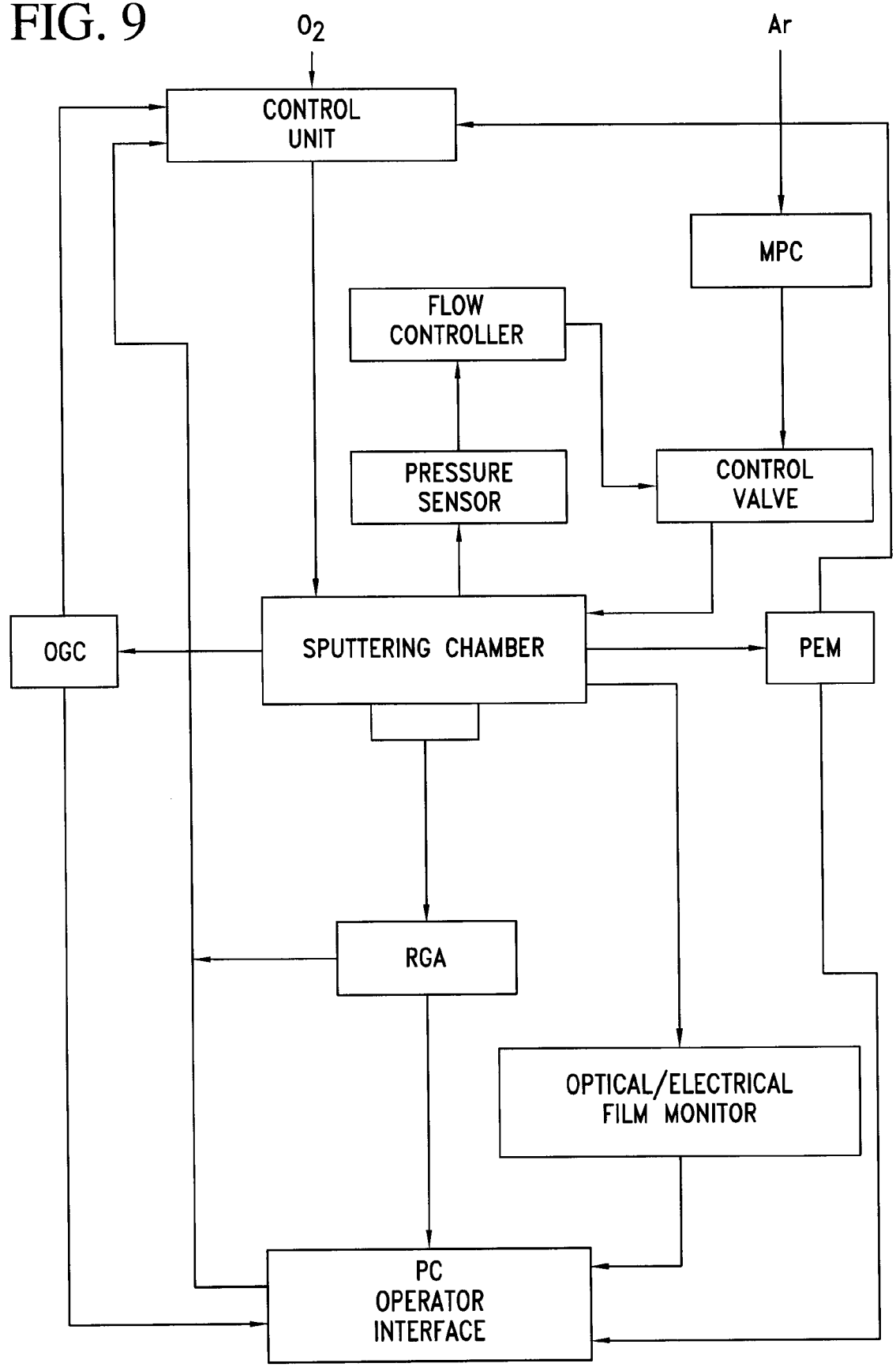
FIG. 9 is a schematic drawing which illustrates the configuration setup of a plasma emission monitor.

The aforementioned publication describes the following experiment. In this experiment, ITO films were deposited from a metallic InSn target in an argon/oxygen mixture. The stoichiometry of the growing film was determined by the reaction between the metal species and the reactive gas arriving at the substrate. To achieve a stable mode of operation, the admission of reactive gas and deposition parameters were carefully controlled. FIG. 9 illustrates the configuration setup of the plasma emission monitor used for this experiment. The optical filter bundle was conducted during a feedthrough into the vacuum chamber and emitted light was sent into an Ebert spectrometer, where it was dispersed into a 512 element photodiode. The input signal of chosen species were monitored while the output signal operated the reactive gas control unit. As changes occurred in the process they were detected and the controller admitted or removed the reactive gas. The emission signals were continually compared to the on-line measured properties of the coated film. The data was analyzed in-situ with a PC and process limits were adjusted to maintain a constant deposition rate through the production run.

Figure 10:
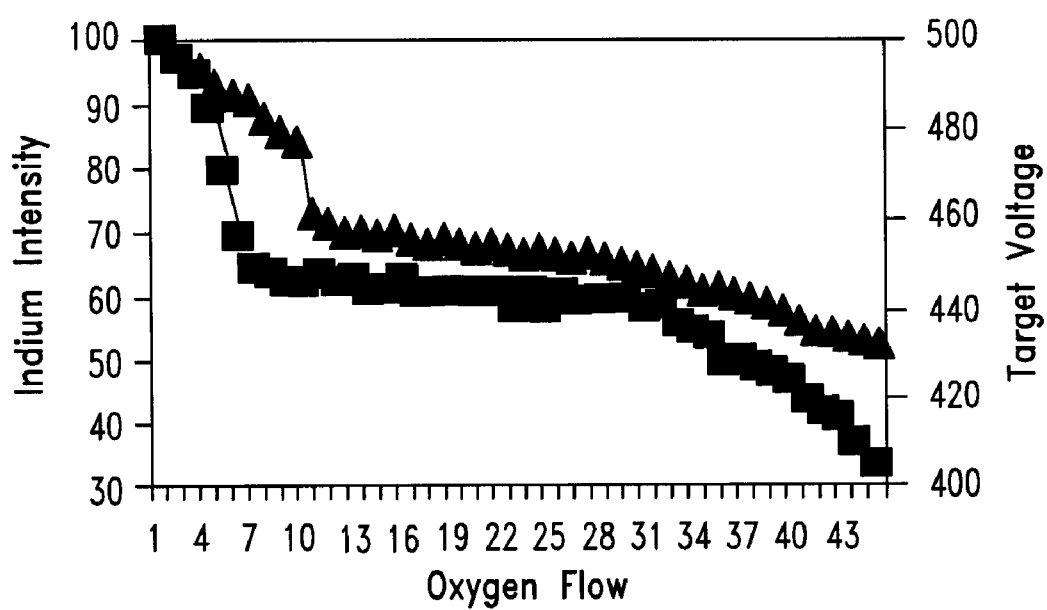
FIG. 10 is a graph which illustrates the typical indium intensity and cathode voltage as a function of oxygen flow.

FIG. 10 illustrates the typical indium intensity and cathode voltage as a function of oxygen flow. By monitoring this relationship over time, one can determine if the process is becoming oxygen rich or deficient. The intensity of In varied with the level of oxygen available in the plasma. This variation could be the result of substrate outgassing, target oxidation, and pumping speed changes. To overcome the possibility of process drift due to the above factors, the emission spectra was correlated to the RGA baseline numbers. It was noted that the intensity of In decreases as the target is saturated with oxygen. Moreover, the cathode current increased to compensate for the lower target conductivity as the surface is saturated with oxygen. During arcing this intensity increased and during outgassing it decreased. The fast response of the PEM, when linked to the process controller, enabled optimum deposition conditions to be maintained constantly.

The use of a PEM for monitoring and controlling reactive ITO provides certain advantages compared to traditional techniques. Some of these advantages include fast feedback loop, direct monitoring of atomic species, longer processing times, reduced target consumption and contamination and excellent downweb coating linearity.

The controlled partial pressure method for controlling oxygen during sputtering does not provide the above advantages and in fact there are some disadvantages associated with this method especially when the discharge becomes unstable and undergoes oscillatory behavior. When the discharge becomes unstable and undergoes oscillatory behavior the subsequent recovery of the process leads to an unacceptable lag time for a high volume manufacturing environment. Stable operation of a reactive process and a faster instrument response time can be achieved by controlling the rate of admission of the reactive gas using the chosen emission line of the metal being sputtered. When a plasma emission monitor is used, the emitted light from the glow discharge is collected by fiber optics and directed to a photomultiplier (PMT) tube that has been configured to accept a 451 nm optical filter. The optical signal generated by the PMT is sent to a control console that operates an oxygen mass flow controller. The fiber optic lens assembly located near the cathode is positioned in a manner to prevent the lens from becoming coated during the sputtering process.

A ratio of the intensity signals Im/Io (where Im is intensity obtained in pure argon and Io is the intensity in the presence of oxygen) is calculated and correlated to the optimum operating point.

It is known in the prior art that as the target surface is further oxidized, the cathode voltage increases to compensate for the lower target conductivity. In the present invention the level of oxygen flow required to stabilize the process with the PEM control circuit was lower than that without the PEM.

The changes in the emission line is strongly correlated to the changes that are occurring on the target surface. During periods of target arcing the intensity is observed to increase. This increase is due to the target surface becoming metal rich. During periods when the substrate is outgassing the intensity decreased.

When using a PEM control system to produce the ITO layers, the level of oxygen introduced into the sputtering zone is lower compared to the level of oxygen used in traditional partial pressure methods. Longer processing times are possible due to a lower rate of target oxidation. The sputter rate is also maintained due to the target surface being kept optimized. The product runs are also more stable since the control circuit responds faster than the partial pressure system.

EXAMPLES 1–4

Figure 11:
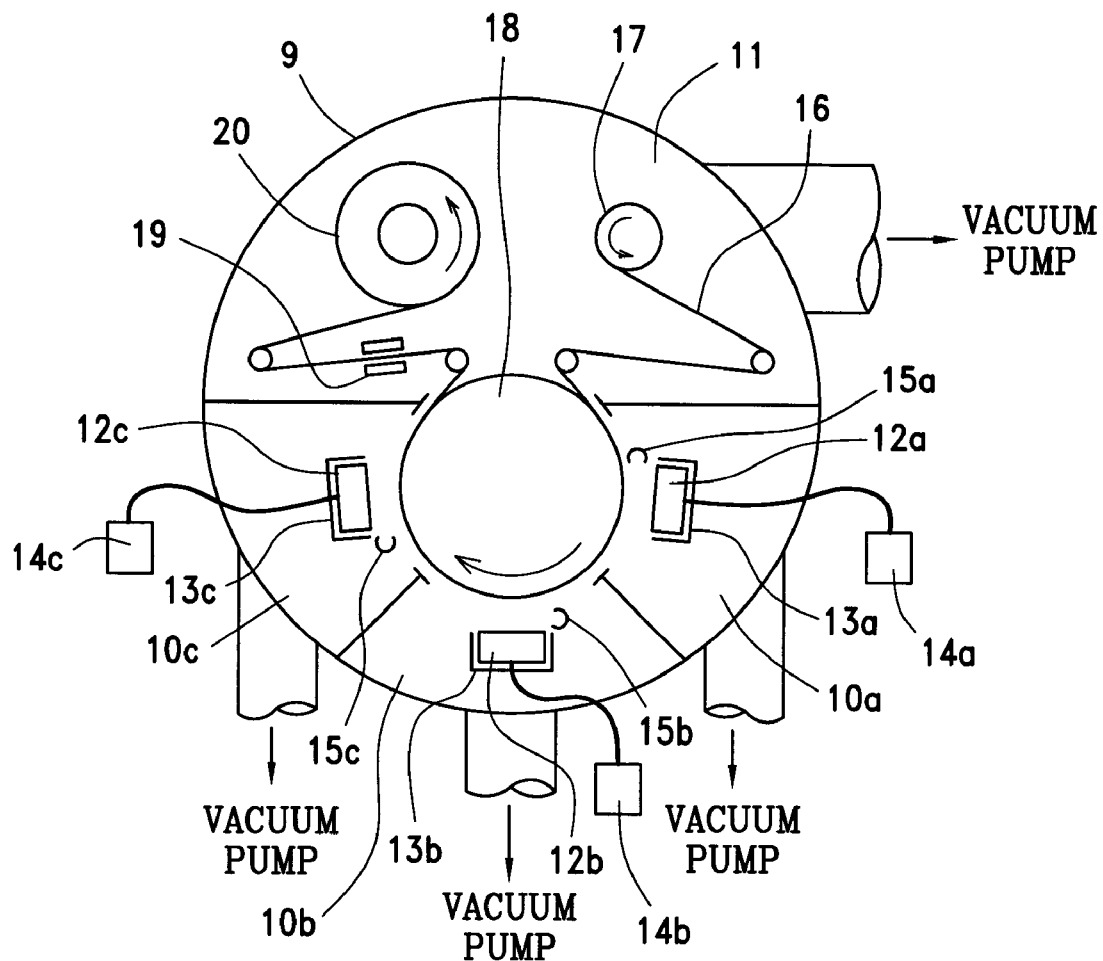
FIG. 11 depicts schematically a three chamber sputter roll coater which can be used to deposit the coatings of this invention.

Examples 1–4, which further illustrate the invention, were prepared using the three-chamber sputter coater described in U.S. Pat. No. 4,977,013. This particular sputter coater is shown schematically in FIG. 11. Sputter coater 9 has three sputtering chambers 10a–10c and an unwind/rewind chamber 11, each having a vacuum outlet. Chambers 10a–10c have sputter sources 12a–12c, having shields 13a–c to control the sputter beam and powered by power sources 14a–c, respectively, and further having controllable gas inlets 15a–c, again respectively, to make them suitable for reactive sputtering. Flexible sheet 16 such as PET, which is to be coated, is unwound from feed roll 17 and carried by chill drum 18 through each of chambers 10a–10c. During its passage through chambers 10a–c, flexible sheet 16 may be coated with successive layers of the same coating material, or layers of different coating materials, and so forth. Monitors 19 provide information on the resistance, optical transmission, and/or other properties of the coating. The coated film is wound onto takeup roll 30. Reactive sputtering is further described in Kittler et al., Proc. SPIE 325, 61 (1982) and Howson et al., Proc. SPIE 324, 17 (1982), the disclosures of which are incorporated herein by reference.

In examples 1–4 the above described three chamber sputter coater was used in a roll-to-roll process to sputter deposit a stack of three ITO coatings on a transparent flexible PET sheet substrate. Thus three sputter stations (i.e., sputtering chambers 10a–10c) were used to deposit the three ITO coatings in each of the examples. The sheet of PET was passed through the three sputtering stations or chambers as the sheet progressed from the feed roll to the take-up roll. The PET sheet was first sputter coated with a first ITO layer as the sheet passed through the first sputtering station. Next the second and third ITO layers were sputter coated in succession on top of the first layer as the sheet passed through the second and third sputtering stations. The speed at which the sheet passed through the stations was controlled to produce the desired thickness for each ITO layer.

The relative amount (atomic percentage) of indium and tin in each of the ITO layers formed in examples 1–4 is shown in table 1. The composition in terms of the relative amount of indium and tin is indicated by giving the atomic % In/atomic % Sn for each ITO layer in the stack of three layers. Thus the first and third layers of ITO in example one contain 95 atomic % In and 5 atomic % Sn (95/5).

TABLE 1

| Layers | Example 1 atomic % In/ atomic % Sn | Example 2 atomic % In/ atomic % Sn | Example 3 atomic % In/ atomic % Sn | Example 4 atomic % In/ atomic % Sn |
|---|---|---|---|---|
| 3rd Layer | 95/5 | 80/20 | 80/20 | 90/10 |
| 2nd Layer | 90/10 | 90/10 | 90/10 | 80/20 |
| 1st Layer | 95/5 | 80/20 | 90/10 | 90/10 |
| Substrate | PET | PET | PET | PET |

The amount of argon, oxygen, power and pressure used in each sputtering station was regulated. The values for each of these parameters for examples 1–4 are shown in table 2. In addition, table 2 shows the speed at which the PET sheet passes through each of the sputtering stations.

TABLE 2

| PROCESS | EXAMPLE 1 | | | EXAMPLE 2 | | | EXAMPLE 3 | | | EXAMPLE 4 | | |
|---|---|---|---|---|---|---|---|---|---|---|---|---|
| STACK | 95/5 | 90/10 | 95/5 | 80/20 | 90/10 | 80/20 | 90/10 | 90/10 | 80/20 | 90/10 | 80/20 | 90/10 |
| GAS ARGON (SCCM) | 100 | 100 | 100 | 100 | 100 | 100 | 100 | 100 | 100 | 100 | 100 | 100 |
| GAS OXYGEN | 30 | 34 | 30 | 36 | 34 | 36 | 34 | 34 | 36 | 34 | 36 | 34 |
| POWER (KW) | 2.5 | 2.5 | 2.5 | 2.8 | 2.5 | 2.8 | 2.5 | 2.5 | 2.8 | 2.5 | 2.8 | 2.5 |
| PRESSURE (MICRON) | 2.5 | 2.5 | 2.5 | 2.5 | 2.5 | 2.5 | 2.5 | 2.5 | 2.5 | 2.5 | 2.5 | 2.5 |
| SPEED (FEET/MIN) | 4.5 | 4.3 | 4.5 | 4.0 | 4.5 | 4.0 | 4.3 | 4.3 | 4.0 | 4.3 | 4.0 | 4.3 |

The physical properties for each of the coated substrates produced in examples 1–4 are compiled in table 3.

TABLE 3

| Properties | Example 1 | Example 2 | Example 3 | Example 4 |
|---|---|---|---|---|
| Resistance (Ro) (Ohms/Sq.) | 119 | 110 | 124 | 115 |
| Abrasion (R/Ro) | 1.0 | 1.0 | 1.0 | 1.0 |
| Adhesion (R/Ro) | 1.0 | 1.0 | 1.0 | 1.01 |
| VLT (%) | 79.4 | 77.5 | 79.1 | 78 |
| Dry Heat (R/Ro) 80 C., 24 hrs | 1.21 | 0.96 | 0.97 | 0.93 |
| Humidity (R/Ro) 60 C., 95%, 24 hrs | 1.06 | 1.0 | 0.96 | 0.92 |
| Flexibility (R/Ro) (.5" mandrel size) | 1.0 | 1.20 | 1.1 | 1.08 |
| Color L* | 90.7 | 89.5 | 89.5 | 89.27 |
| Color a* | 0.43 | 0.56 | .45 | 0.5 |
| Color b* | 4.39 | 2.01 | 2.8 | 2.72 |
| YID | 8.8 | 4.48 | 5.9 | 5.82 |
| Overall Thickness (Å) | ~550 | ~850 | ~750 | ~750 |

Figure 4:
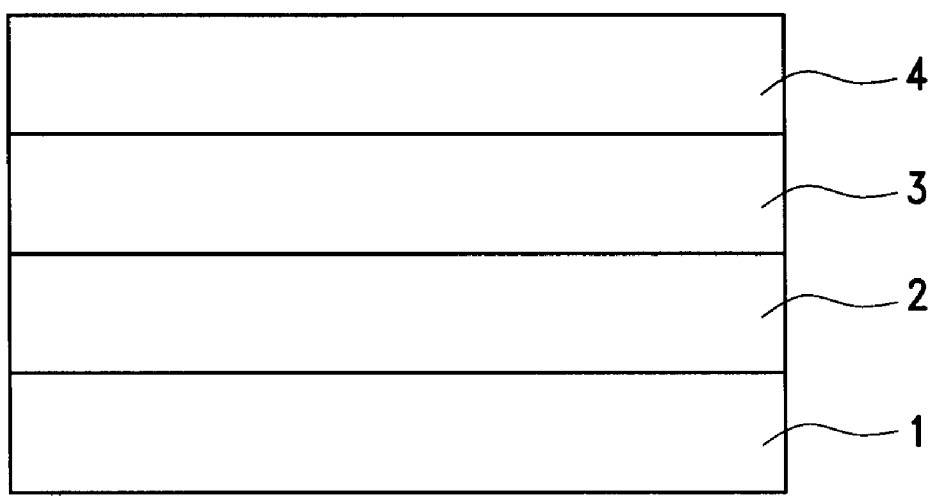
FIG. 4 is a cross-sectional illustration of another embodiment of the invention which includes a plurality of ITO layers on a substrate.

The structure of examples 1–4 is illustrated in FIG. 4. Thus, FIG. 4 contains substrate 1 which in examples 1–4 is PET. The first ITO layer 2 in examples 1–4 is deposited on the substrate. The second ITO layer 3 in examples 1–4 is deposited on top of layer 2 and the third ITO layer 4 is deposited on top of the second layer.

The coatings in example 1–4 were deposited with the intention of obtaining similar resistance ranges for all layer structures. All coatings exhibited good adhesion and abrasion to the substrate. The visible light transmission varies for each structure due to varying thickness and ITO compositions employed for those structures.

Dry heat and humidity typically have the greatest influence on the electrical properties of ITO films. This is mainly due to absorption of oxygen and moisture, which can substitute within the interstitial sites, of a particular ITO composition. This reaction can drive the resistance of ITO coatings up or down, depending on the composition of layers and typically the outermost layer being in contact with that particular environment.

Flexibility is greatly influenced as a function of mandrel diameter and ITO thickness. For purposes of these experiments, we standardize on a 0.5" diameter mandrel. Flexibility test is performed by running the film over a 0.5" diameter mandrel in several cycles. The film is in tensile mode, i.e., not touching the mandrel when being run over the mandrel. It can be observed that the thicker the coating, the lesser its flexibility or higher its R/Ro.

The optical properties of the films in examples 1–4 vary due to thickness and composition of ITO layers. Typically, ITO films with a higher amount of tin have a higher color value. However, color can also vary due to thickness of the overall structure irregardless of ITO compositions.

In summery, one can tailor design specific ITO film structures for particular applications. Not every ITO is suitable for another ITO application. One familiar with the art needs to design and optimize ITO film structures for each application in order to maximize on the most demanding requirements of that application. For example, for applications such as EL lamps where durability and environmental stability is a concern, example 4 given in table 3 may be a preferred structure. Alternatively, example 1 is more suitable for PDA application where flexibility and optical properties are the main concerns.

As noted above, each ITO layer in the stack has a finite thickness. Thus, the concentration of indium and tin varies in a stepwise fashion throughout the thickness of the layers. This stepwise change in concentration has been verified by subjecting the multilayered structures of examples 1–4 to Auger electron spectroscopy (AES).

Auger electron spectroscopy uses a focused electron beam to create secondary electrons near the surface of a solid sample. Some of these (the Auger electrons) have energies characteristic of the elements and, in many cases, of the chemical bonding of the atoms from which they are released. Because of their characteristic energies and the shallow depth from which they escape without energy loss, Auger electrons are able to characterize the elemental composition and, at times, the chemistry of the surface of samples. When used in combination with ion sputtering to gradually remove the surface, Auger spectroscopy can similarly characterize the sample in depth. The high spatial resolution of the electron beam and the process allows micro-analysis of three-dimensional regions of solid samples. AES has the attributes of high lateral resolution, relatively high sensitivity, standardless semiquantitative analysis, and chemical bonding information in some cases.

Figure 5A:
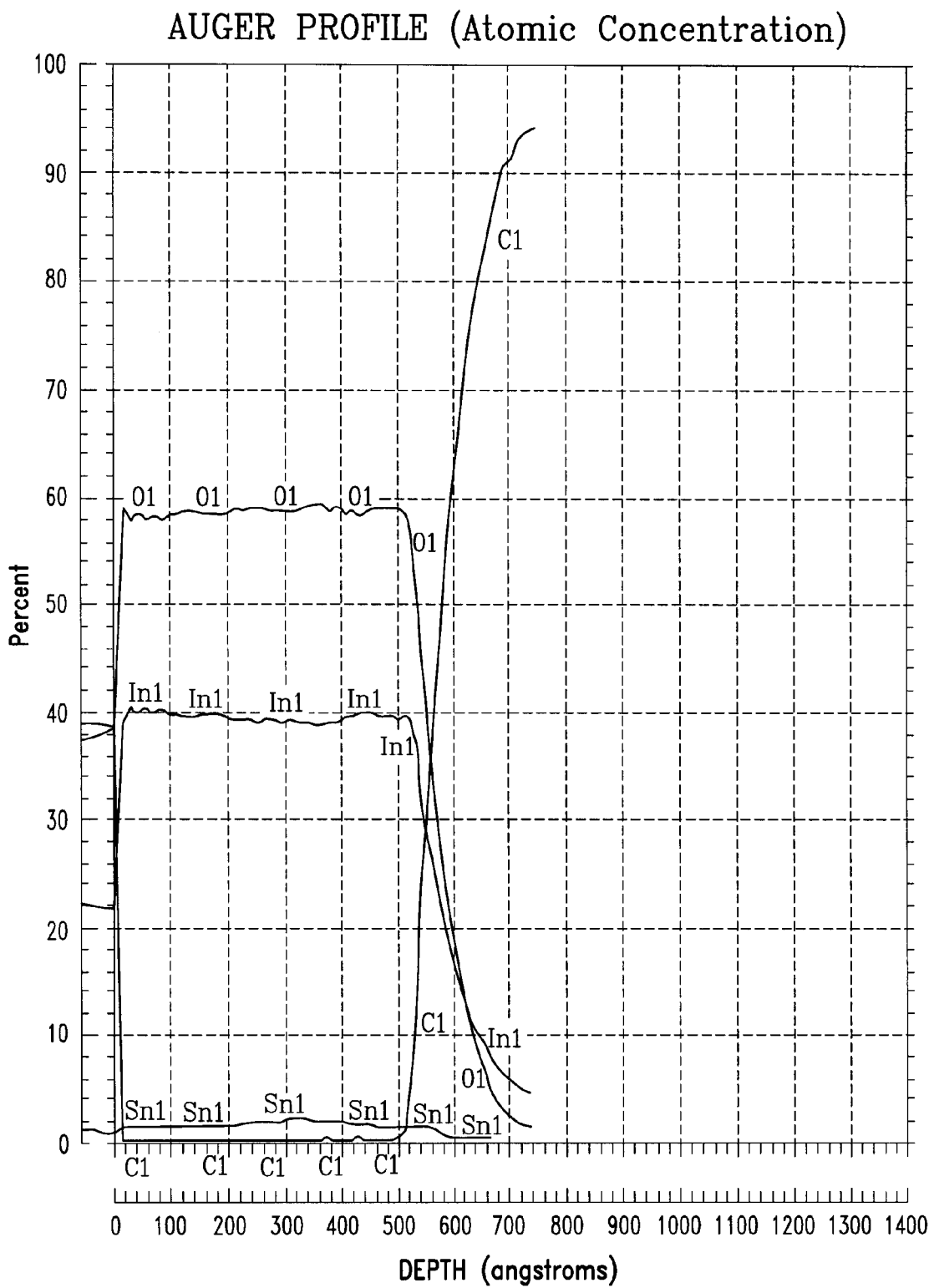
FIGS. 5A–8B are Auger graphs which show the compositional changes throughout the depth of the ITO layers which are used in the examples of the invention.
Figure 5B:
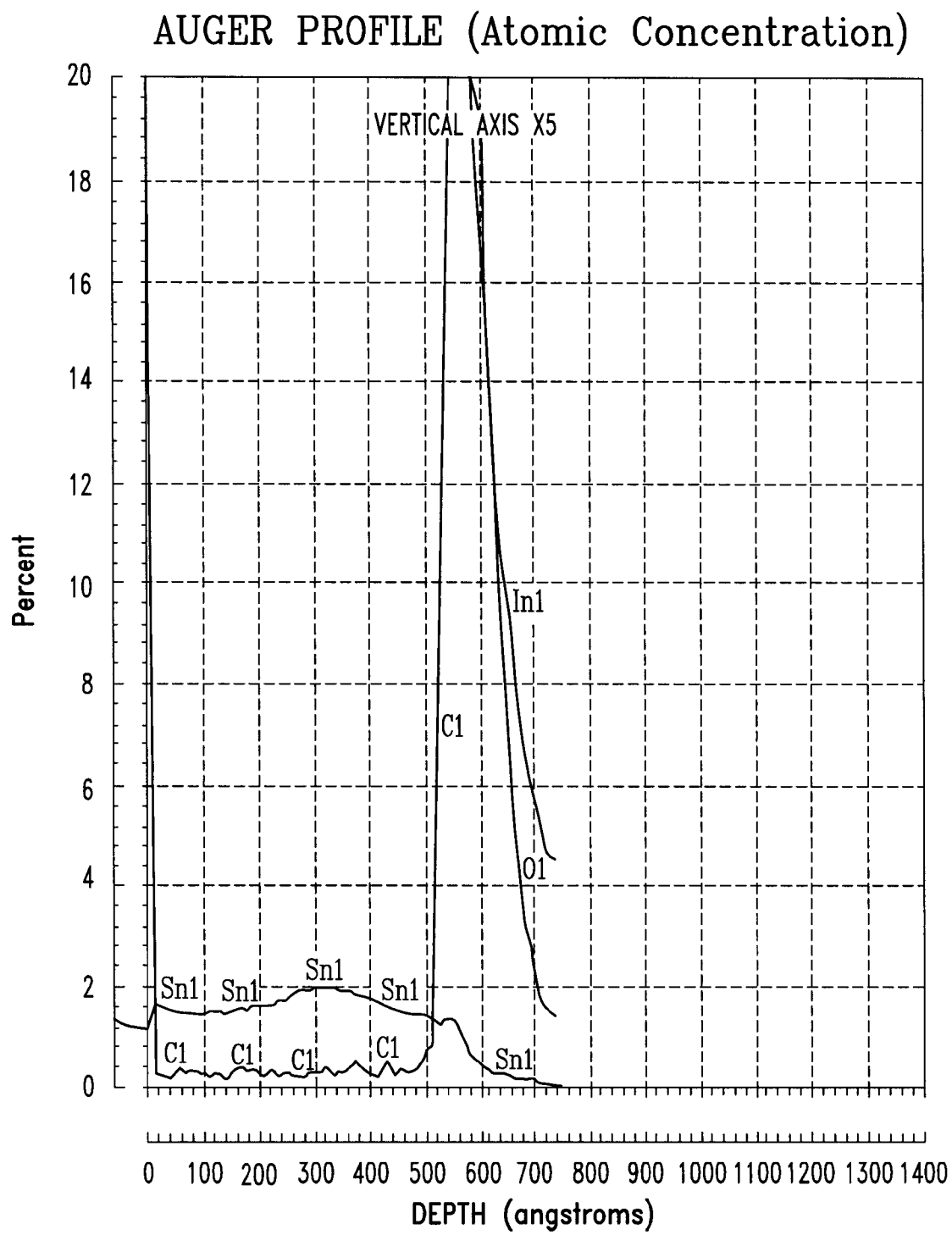
Figure 6A:
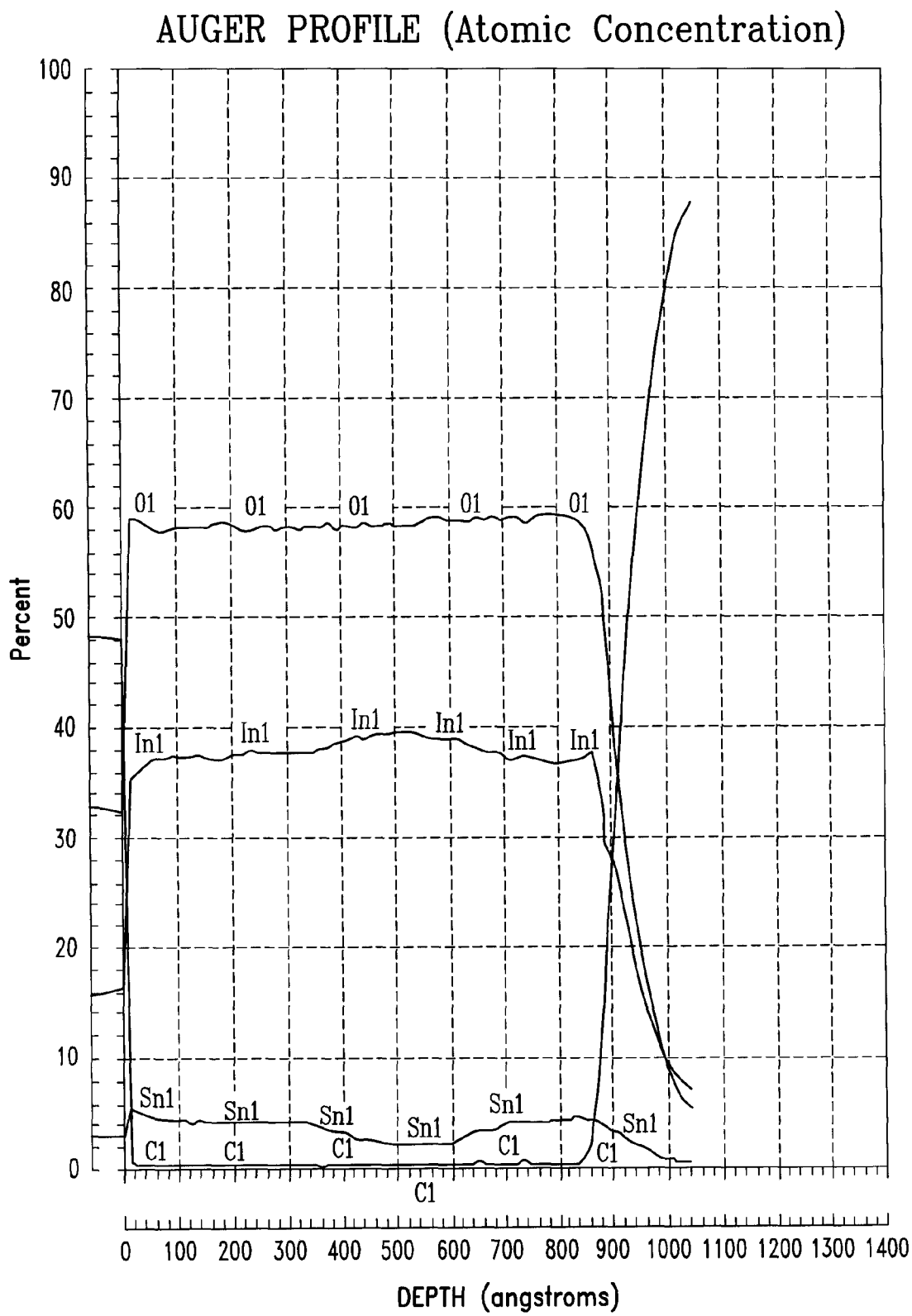
Figure 6B:
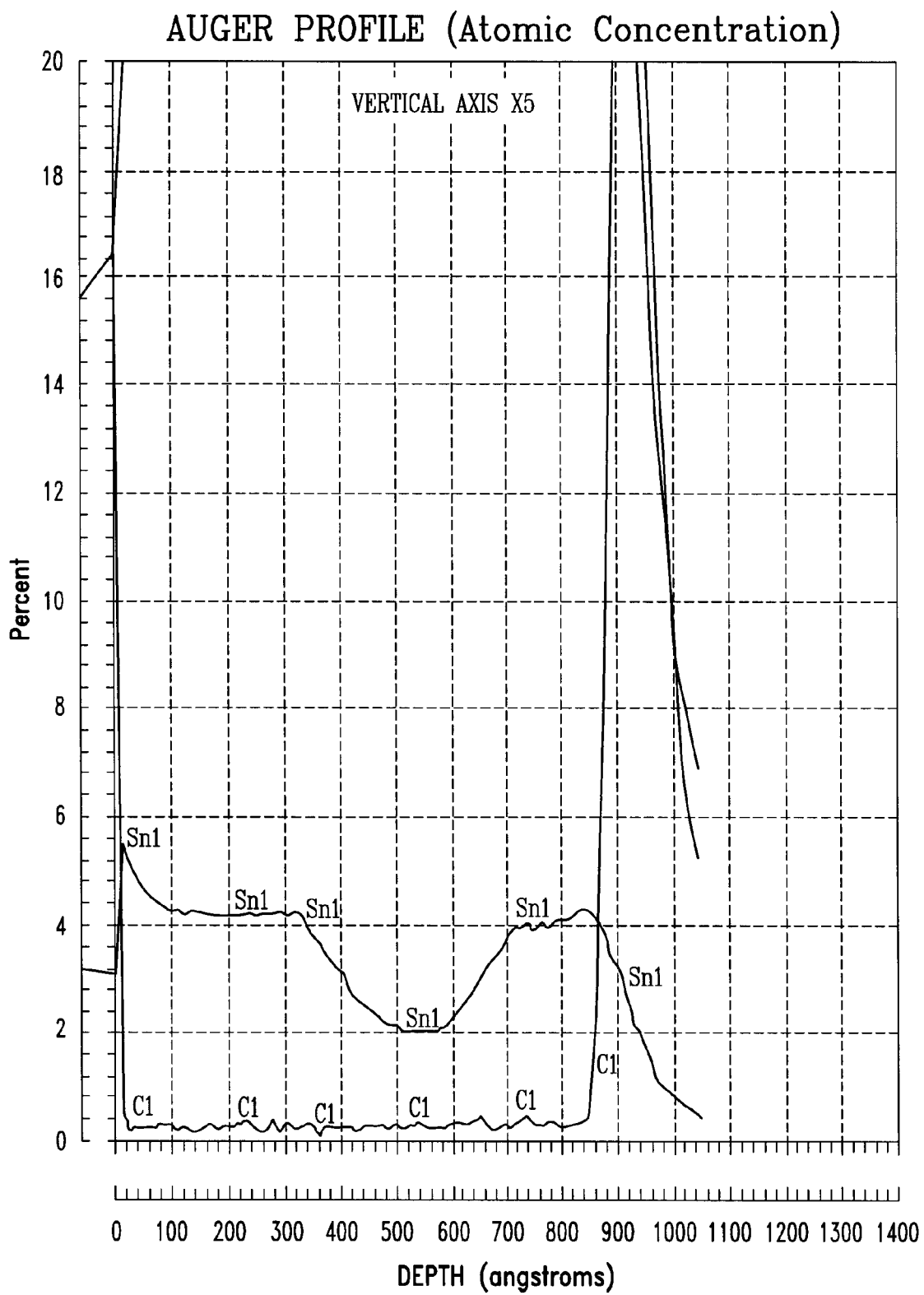
Figure 7A:
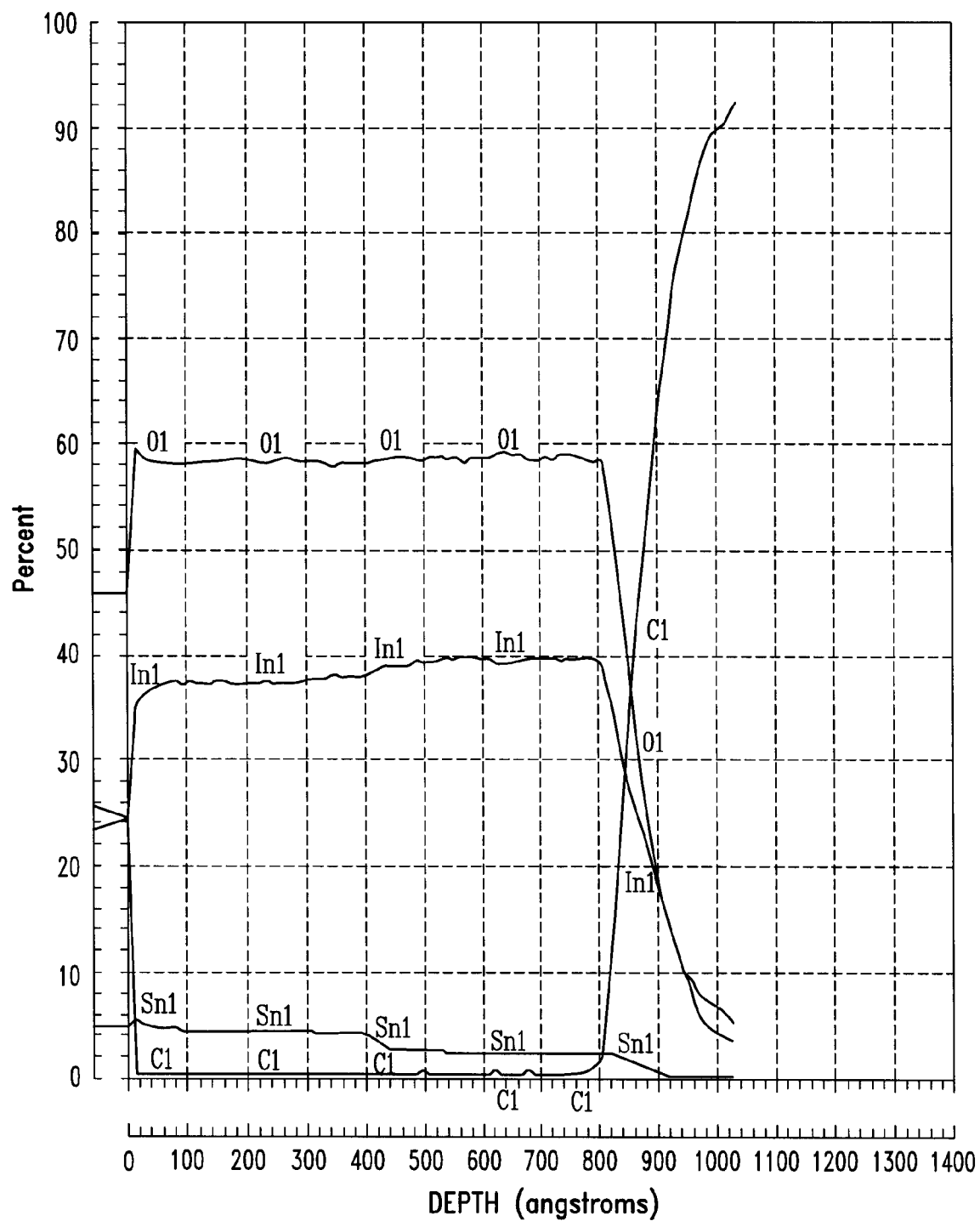
Figure 7B:
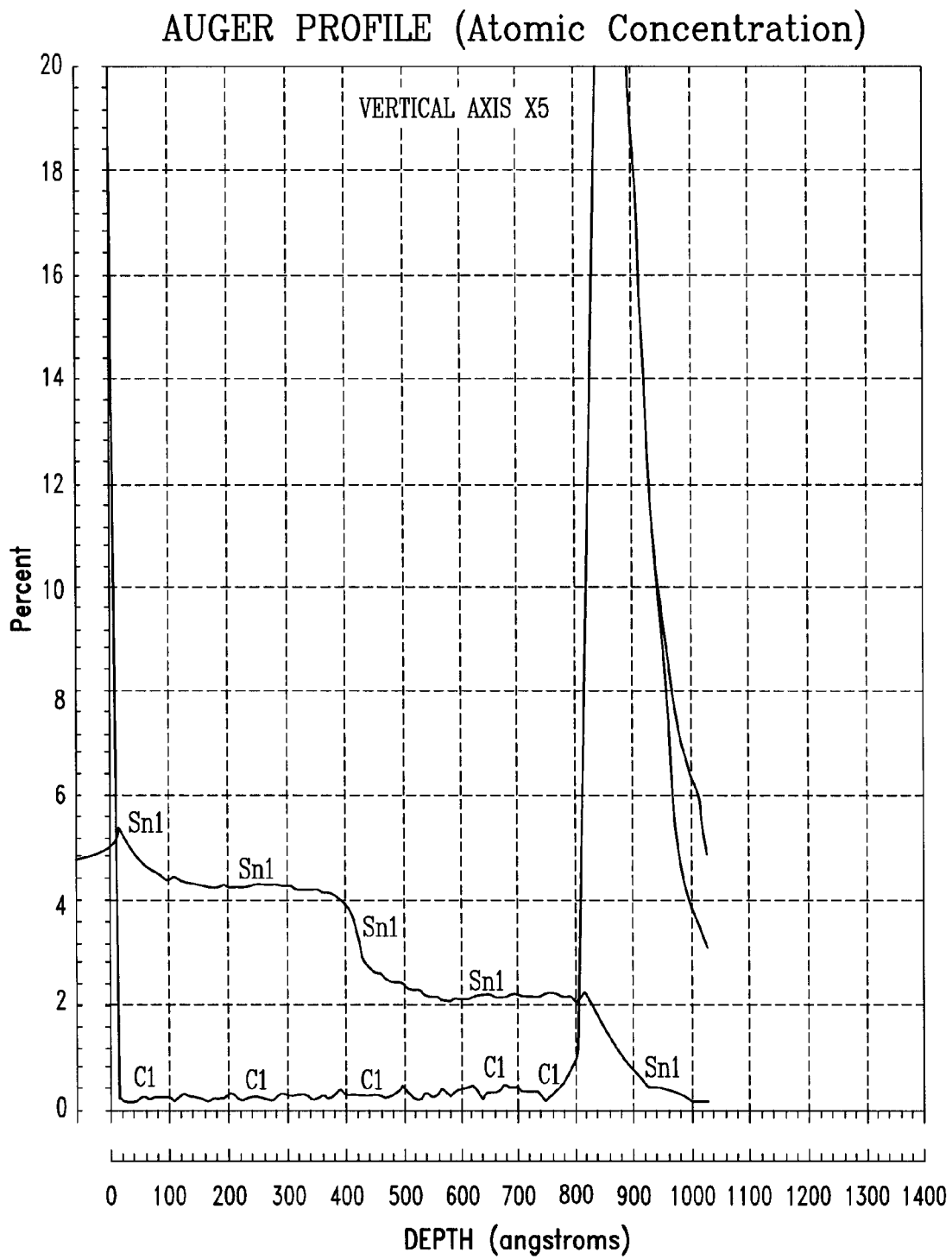
Figure 8A:
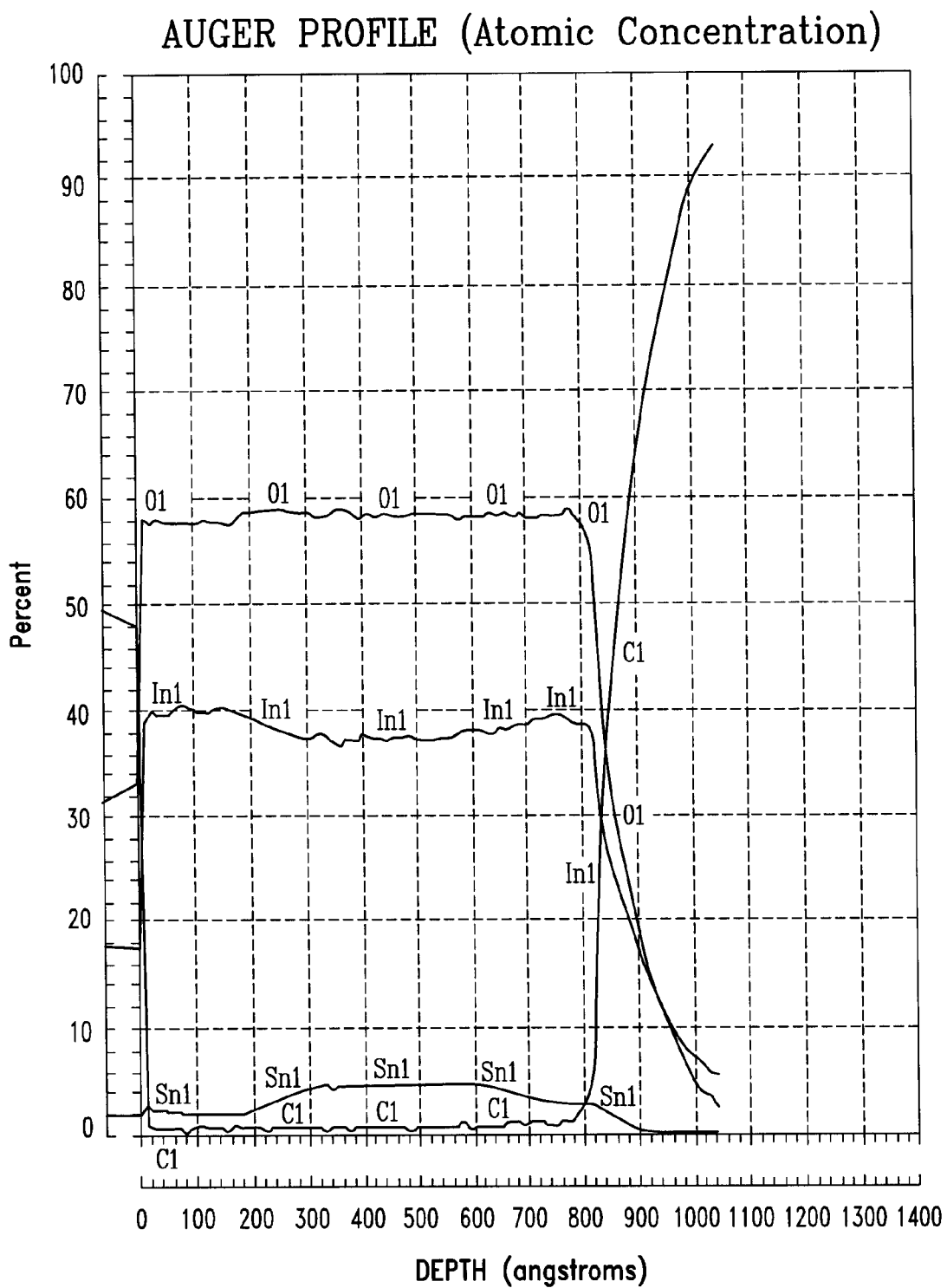
Figure 8B:
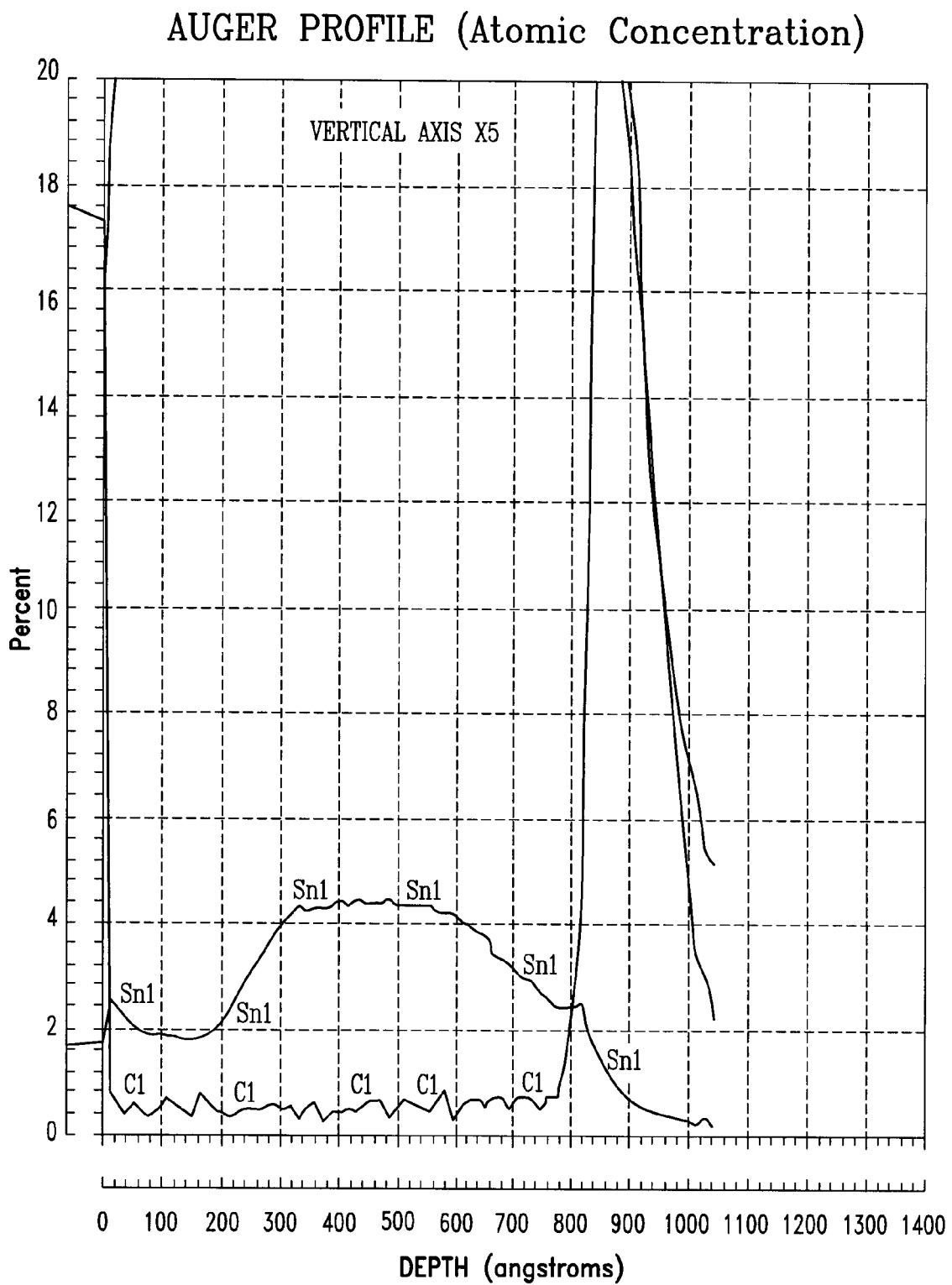

Thus the data obtained by AES can be graphically represented to show compositional details throughout the thickness of the ITO layers. A pair of figures is utilized to illustrate the Auger profile of examples 1–4. FIGS. 5A and 5B show the Auger profile of example 1. FIGS. 6A and 6B show the Auger profile of example 2. FIGS. 7A and 7B show the Auger profile of example 3 and FIGS. 8A and 8B show the Auger profile of example 4.

Each figure shows the relative amounts of carbon, tin, indium and oxygen at various depths of the film by means of line graphs (i.e., the vertical axis of each graph shows the percent or relative amount of the elements). Thus each figure plots the relative amount of the above elements throughout the depth with lines C1, Sn1, In1 and O1 for carbon, tin, indium and oxygen respectively.

Referring now to FIG. 5A, it can be seen that carbon does not appear in any significant amount until a depth of about 500 angstroms is reached. Carbon first shows up at 500 angstroms because at this depth the PET substrate is reached which is high in carbon. Thus FIG. 5A shows that the entire thickness of the ITO layers in example 1 has a thickness of about 500 angstroms.

FIG. 5A also shows that the amount of indium in the middle portion of the ITO layer is less than the amount of indium in the top and bottom portions of the ITO layer which is consistent with the compositional details shown in table 1.

The relative amount of tin throughout the thickness of the ITO layers is difficult to perceive from FIG. 5A because the amount of tin is at the lower end of the vertical axis. Thus an expanded FIG. 5B was prepared which magnifies the lower portion of the vertical axis from FIG. 5A to better illustrate the variation of tin throughout the thickness of the ITO layers. FIG. 5B shows that the middle portion of the ITO layers contains a higher content of tin than the top and bottom layers which is consistent with the compositional details shown in table 1.

FIGS. 6A–8B depict the Auger profiles of examples 2–4 in the same manner that FIGS. 5A and 5B depict the Auger profile of example 1.

While the present invention has been described in terms of certain preferred embodiments, one skilled in the art will readily appreciate that various modifications, changes, omissions and substitutions may be made without departing from the spirit thereof. It is intended, therefore, that the present invention be limited solely by the scope of the following claims.

What is claimed is:

1. In a multi-layered electronic device which comprises a transparent substrate coated with at least one transparent electrically conductive film of indium tin oxide, wherein the improvement comprises:

the at least one indium tin oxide film has a proportion of indium to tin atoms which is nonuniform, having no continuous gradient of compositional change, throughout the entire thickness of the film, such that the indium and tin atoms are distributed throughout the thickness of said film to form a plurality of electrically conductive indium tin oxide layers, at least one surface of each of the electrically conductive layers is in contact with a surface of one of the other said layers, each of said layers having a finite thickness of 5–10,000 angstroms, wherein the proportion of indium to tin is substantially uniform throughout said finite thickness; wherein the proportion of indium to tin in at least one of said layers is different from the proportion of indium to tin in another of said layers, the proportions of indium and tin adding up to unity in each layer with respect to the total amount of indium and tin contained in each layer.

2. The device of claim 1 wherein the atomic percent of tin based upon the total content of indium and tin in each of the indium tin oxide layers is 1 atomic percent-99 atomic percent.

3. The device of claim 2 wherein said transparent substrate is a flexible polymeric sheet.

4. The device of claim 3 wherein said flexible polymeric sheet is selected from the group consisting of polyester, polysulfone, polycarbonate and polyurethane.

5. The device of claim 4 wherein said polyester is polyethylene terephthalate.

6. The device of claim 3 wherein said film has a sheet resistance which varies from 1 to 10,000 ohms per square.

7. The device of claim 6 which has a visible light transparency which is greater than 75%.

8. The device of claim 5 wherein said polyethylene terephthalate is heat stabilized.

9. The device of claim 4 which includes a scratch resistant hardcoat layer located above and/or below said substrate whereby a hardcoat layer is interposed between said indium tin oxide film and said substrate.

10. The device of claim 9 wherein said hardcoat has a thickness in the range of 5,000 to 100,000 angstroms.

11. The device of claim 9 which includes a protective topcoat layer on a top surface of said device and/or a protective topcoat layer on a bottom surface of said device.

12. The device of claim 11 which comprises the sequence of layers: protective topcoat/substrate/hardcoat/primer/ indium tin oxide film/protective topcoat; said primer of said primer layer being adhesive primer or a barrier primer.

13. The device of claim 11 which includes a primer layer in between any of the layers of said multilayered device; said primer of said primer layer being adhesion primer or barrier primer.

14. The device of claim 13 which includes a plurality of primer layers.

15. The device of claim 14 wherein said adhesion primer layer is metal, metal nitride, metal oxide or metal carbide and said barrier primer layer is an organic compound.

16. The device of claim 15 wherein said adhesion primer layer has a thickness in the range of 5–10,000 angstroms and the barrier primer layer has a thickness in the range of 50–10,000 angstroms.

17. The device of claim 15 wherein the adhesion primer layer is selected from the group consisting of metal, oxide of said metal and nitride of said metal; wherein said metal is selected from the group consisting of W, Ti, Cr, Ni, Cu, Zr, Hf, Ta, Al and Si.

18. The device of claim 17 wherein said adhesion primer layer is selected from the group consisting of $TiO_2$, $Al_2O_3$, $Ta_2O_5$, IZO, TiN, ZrN, TiC and $W_2C$.

19. The device of claim 13 wherein said at least one indium tin oxide film comprises a plurality of indium tin oxide films.

20. The device of claim 19 wherein said plurality of films includes at least one pair of films.

21. The device of claim 13 which contains a single indium tin oxide film.

22. The device of claim 21 wherein said film consists of a first indium tin oxide layer next to a second indium tin oxide layer wherein said second indium tin oxide layer is adjacent to said substrate or said primer layer; or said second indium tin oxide layer is adjacent to said hardcoat and said hardcoat is adjacent to said substrate.

23. The device of claim 8 wherein said at least one film consists of a first indium tin oxide layer next to a second indium tin oxide layer; said device including a scratch resistant hardcoat layer located above and/or below said substrate; and a primer layer next to one or both sides of said film and/or next to one or both sides of said substrate, or said hardcoat layer or layers.

24. The device of claim 23 which contains a single indium tin oxide film.

25. The device of claim 24 wherein said indium tin oxide film has a thickness of 10–100,000 angstroms, a sheet resistance of 1–10,000 ohms per square and said device a visible light transparency which is greater than 75%.

26. The device of claim 8 wherein said at least one film consists of a lower indium tin oxide layer, a middle indium tin oxide layer and an upper indium tin oxide layer; said middle indium tin oxide layer being coated onto a top surface of said lower indium tin oxide layer and said upper indium tin oxide layer being coated onto a top surface of said middle indium tin oxide layer; said device including a scratch resistant hardcoat layer located above and/or below said substrate; and a primer layer next to one or both sides of said film and/or next to one or both sides of said substrate or said hardcoat layer or layers.

27. The device of claim 23 which contains a single indium tin oxide film.

28. The device of claim 26 which includes an organic or inorganic protective topcoat layer on a top surface of said device and/or a protective topcoat layer on a bottom surface of said device.

29. The device of claim 28 wherein said protective topcoat layer is metal, metal oxide, metal nitride or metal carbide.

30. The device of claim 29 wherein said protective topcoat is:
   metal selected from the group consisting of Pd, Au, Ni and Cr;
   metal alloy selected from the group consisting of NiCr, AuAg, CuPd and CuAg;
   metal oxide selected from the group consisting of $SiO_2$, $TiO_2$, $Al_2O_3$, IZO and $Ta_2O_5$;
   metal nitride selected from the group consisting of TiN and $Si_3N_4$;
   metal carbide selected from the group consisting of TiC and $W_2C$; or
   combinations of said metal, metal alloy, metal oxide, metal nitride or metal carbide.

31. The device of claim 30 wherein said protective topcoat has a thickness in the range of 5–5,000 angstroms.

32. The device of claim 28 wherein said protective topcoat is organic.

33. The device of claim 32 wherein the organic topcoat is applied in the form of an organo-titanium based solution.

34. The device of claim 33 wherein the organic topcoat has a thickness in the range of 10–100,000 angstroms.

35. The device of claim 4 wherein said at least one indium tin oxide film includes an indium tin oxide film above said substrate and an indium tin oxide film below said substrate whereby said substrate is sandwiched between said film above said substrate and said film below said substrate; said device further including one or more scratch resistant hardcoat layers, one or more primer layers and a protective topcoat layer on a top surface of said device and/or a protective topcoat layer on a bottom surface of said device.

36. An electronic apparatus which comprises the device of claim 1 as a component thereof; said electronic apparatus being selected from the group consisting of transparent touch panels, electroluminescent lamps, personal digital assistants, pen entry devices, liquid crystal displays and organic light emitting devices.

37. The device of claim 4 wherein the thickness of each indium tin oxide layer of said at least one film is at least about 50 angstroms.

38. The device of claim 5 which contains a single indium tin oxide film; said single indium tin oxide film having a lower indium tin oxide layer, a middle indium tin oxide layer and an upper indium tin oxide layer; said middle indium tin oxide layer being coated onto a top surface of said lower indium tin oxide layer and said upper indium tin oxide layer being coated onto a top surface of said middle indium tin oxide layer; said upper and lower indium tin oxide layers containing 95 atomic percent indium and 5 atomic percent tin; and said middle layer containing 90 atomic percent indium and 10 atomic percent tin wherein the atomic percent of indium and tin in each layer is based upon the total content of indium and tin in said each layer.

39. The device of claim 5 which contains a single indium tin oxide film; said single indium tin oxide film having a lower indium tin oxide layer, a middle indium tin oxide layer and an upper indium tin oxide layer; said middle indium tin oxide layer being coated onto a top surface of said lower indium tin oxide layer and said upper indium tin oxide layer being coated onto a top surface of said middle indium tin oxide layer; said upper and lower indium tin oxide layers containing 80 atomic percent indium and 20 atomic percent tin; and said middle indium tin oxide layer containing 90 atomic percent indium and 10 atomic percent tin; wherein the atomic percent of indium and tin in each layer is based upon the total content of indium and tin in said each layer.

40. The device of claim 5 which contains a single indium tin oxide film; said single indium tin oxide film having a lower indium tin oxide layer, a middle indium tin oxide layer and an upper indium tin oxide layer; said middle indium tin oxide layer being coated onto a top surface of said lower indium tin oxide layer and said upper indium tin oxide layer being coated onto a top surface of said middle indium tin oxide layer; said middle and lower indium tin oxide layers containing 90 atomic percent indium and 10 atomic percent tin; and said upper indium tin oxide layer containing 80 atomic percent indium and 20 atomic percent tin; said atomic percent of indium and tin in each layer being based upon the total content of indium and tin in said each layer.

41. The device of claim 5 which contains a single indium tin oxide film; said single indium tin oxide film having a lower indium tin oxide layer, a middle indium oxide layer and an upper indium tin oxide layer; said middle indium tin oxide layer being coated onto a top surface of said lower indium tin oxide layer and said upper indium tin oxide layer being coated onto a top surface of said middle indium tin oxide layer; said upper and lower indium tin oxide layers containing 90 atomic percent indium and 10 atomic percent tin; and said middle indium tin oxide layer containing 80 atomic percent indium and 20 atomic percent tin; wherein the atomic percent of indium and tin in each layer is based upon the total content of indium and tin in said each layer.

* * * * *